US007973686B2

(12) United States Patent
Nishimura

(10) Patent No.: US 7,973,686 B2
(45) Date of Patent: Jul. 5, 2011

(54) INTEGRATED CIRCUIT DEVICE AND ELECTRONIC INSTRUMENT

(75) Inventor: Motoaki Nishimura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/688,341

(22) Filed: Jan. 15, 2010

(65) Prior Publication Data

US 2010/0225511 A1 Sep. 9, 2010

(30) Foreign Application Priority Data

Mar. 6, 2009 (JP) ................................. 2009-053510

(51) Int. Cl.
*H03M 1/06* (2006.01)

(52) U.S. Cl. ........ 341/118; 341/119; 341/120; 341/121; 341/144; 345/76; 345/77; 345/80; 345/204

(58) Field of Classification Search .......... 341/118–121, 341/144; 345/76, 78, 80
See application file for complete search history.

(56) References Cited

U.S. PATENT DOCUMENTS

| | | | | |
|---|---|---|---|---|
| 6,232,946 | B1 * | 5/2001 | Brownlow et al. | 345/98 |
| 6,384,806 | B1 * | 5/2002 | Matsueda et al. | 345/89 |
| 6,950,045 | B2 * | 9/2005 | Kim | 341/118 |
| 7,002,594 | B2 | 2/2006 | Yoshida et al. | |
| 7,443,540 | B2 | 10/2008 | Kasai et al. | |
| 7,728,831 | B2 * | 6/2010 | Yaita et al. | 345/212 |
| 7,777,759 | B2 | 8/2010 | Yoshida et al. | |
| 7,821,522 | B2 | 10/2010 | Yoshida et al. | |
| 2005/0156834 | A1 * | 7/2005 | Jo et al. | 345/76 |
| 2006/0077143 | A1 * | 4/2006 | Kwon | 345/77 |
| 2007/0052632 | A1 * | 3/2007 | Wu et al. | 345/76 |
| 2007/0262972 | A1 * | 11/2007 | Nakata | 345/204 |
| 2008/0266231 | A1 | 10/2008 | Umeda | |
| 2009/0009498 | A1 * | 1/2009 | Nishimura | 345/205 |
| 2009/0033687 | A1 | 2/2009 | Kasai et al. | |
| 2010/0141493 | A1 * | 6/2010 | Cho et al. | 341/122 |

FOREIGN PATENT DOCUMENTS

| | | |
|---|---|---|
| JP | A-05-216430 | 8/1993 |
| JP | A-06-118908 | 4/1994 |
| JP | A-2008-295018 | 4/1994 |
| JP | A-06-149182 | 5/1994 |
| JP | A-2001-337667 | 12/2001 |
| JP | A-2002-108298 | 4/2002 |
| JP | A-2002-366080 | 12/2002 |
| JP | A-2005-055487 | 3/2005 |
| JP | A-2006-098640 | 4/2006 |
| JP | A-2007-233109 | 9/2007 |

* cited by examiner

*Primary Examiner* — Linh V Nguyen
(74) *Attorney, Agent, or Firm* — Oliff & Berridge, PLC

(57) ABSTRACT

An integrated circuit device includes a plurality of data line driver circuits, a first correction D/A conversion circuit, and a plurality of D/A conversion circuits. Each of the data line driver circuits includes an operational amplifier, an input capacitor, and a first correction capacitor. Each of the D/A conversion circuits outputs an output signal to the input capacitor. The first correction D/A conversion circuit outputs a correction output voltage to the first correction capacitors to correct data signals output from the data line driver circuits.

16 Claims, 20 Drawing Sheets

INITIALIZATION PERIOD

OUTPUT PERIOD

INITIALIZATION PERIOD

OUTPUT PERIOD

INITIALIZATION PERIOD

OUTPUT PERIOD

SAMPLING PERIOD

HOLD PERIOD

SAMPLING PERIOD

HOLD PERIOD

INTEGRATED CIRCUIT DEVICE AND ELECTRONIC INSTRUMENT

Japanese Patent Application No. 2009-53510 filed on Mar. 6, 2009, is hereby incorporated by reference in its entirety.

BACKGROUND

The present invention relates to an integrated circuit device, an electronic instrument, and the like.

In recent years, an increase in image quality of a liquid crystal display device (electro-optical device) provided in an electronic instrument (e.g., portable telephone) has progressed. Therefore, a driver (integrated circuit device) that drives a liquid crystal display device is required to implement high-quality image display.

For example, the image quality of a liquid crystal display device may deteriorate due to display non-uniformity (e.g., luminance non-uniformity or color non-uniformity). Such display non-uniformity may be reduced by correcting image data to correct a data voltage (data signal) output from a driver (see JP-A-2002-108298, for example). However, this method allows the data voltage to be corrected by only a voltage step that depends on the grayscale characteristics of a D/A conversion circuit. For example, if a grayscale voltage corresponding to the gamma characteristics of a liquid crystal display device is used when subjecting image data to digital-to-analog conversion (D/A conversion), the image data can be corrected by only an irregular (unequal-interval) voltage value. In order to correct image data by a regular (equal-interval) voltage value, a regular grayscale voltage may be used when subjecting the image data to D/A conversion. However, this method makes it necessary to perform a calculation process on the image data in order to perform gamma correction on the liquid crystal display device.

SUMMARY

According to one aspect of the invention, there is provided an integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a plurality of D/A conversion circuits that are respectively provided corresponding to the plurality of data line driver circuits, each of the plurality of D/A conversion circuits receiving image data, and outputting an output signal that corresponds to the image data, each of the plurality of data line driver circuits including:

an operational amplifier;

an input capacitor that is provided between a summing node and an input node of the data line driver circuit, the summing node being connected to a first input terminal of the operational amplifier; and a first correction capacitor that is provided between the summing node and a first correction input node of the data line driver circuit, each of the plurality of D/A conversion circuits outputting the output signal to the input capacitor of the corresponding data line driver circuit among the plurality of data line driver circuits, and the first correction D/A conversion circuit outputting the first correction output signal to the first correction capacitors of the plurality of data line driver circuits to correct data signals output from the plurality of data line driver circuits.

According to another aspect of the invention, there is provided an integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a second correction D/A conversion circuit that receives second correction data, and outputs a second correction output signal that corresponds to the second correction data, each of the plurality of data line driver circuits including:

an operational amplifier;

an input capacitor that is provided between a summing node and an input node of the data line driver circuit, the summing node being connected to a first input terminal of the operational amplifier; and a correction capacitor that is provided between the summing node and a correction input node of the data line driver circuit, and a signal that is obtained by dividing a signal between the first correction output signal and the second correction output signal being input to the correction capacitor of each of the plurality of data line driver circuits.

According to another aspect of the invention, there is provided an integrated circuit device comprising:

a plurality of data line driver circuits, each of the plurality of data line driver circuits driving a corresponding data line among a plurality of data lines;

a plurality of correction D/A conversion circuits that are respectively provided corresponding to the plurality of data line driver circuits; and a plurality of D/A conversion circuits that are respectively provided corresponding to the plurality of data line driver circuits, each of the plurality of data line driver circuits including:

an operational amplifier;

an input capacitor that is provided between a summing node and an input node of the data line driver circuit, the summing node being connected to a first input terminal of the operational amplifier; and a correction capacitor that is provided between the summing node and a correction input node of the data line driver circuit, each of the plurality of D/A conversion circuits receiving image data, and outputting an output signal that corresponds to the image data to the input capacitor of the corresponding data line driver circuit among the plurality of data line driver circuits, and each of the plurality of correction D/A conversion circuits receiving correction data that corresponds to the corresponding data line driver circuit among the plurality of data line driver circuits, and outputting a correction output signal that corresponds to the correction data to the correction capacitor to correct a data signal output from the corresponding data line driver circuit.

According to another aspect of the invention, there is provided an electronic instrument comprising one of the above integrated circuit devices.

DESCRIPTION OF EXEMPLARY EMBODIMENTS

Figure 1A:
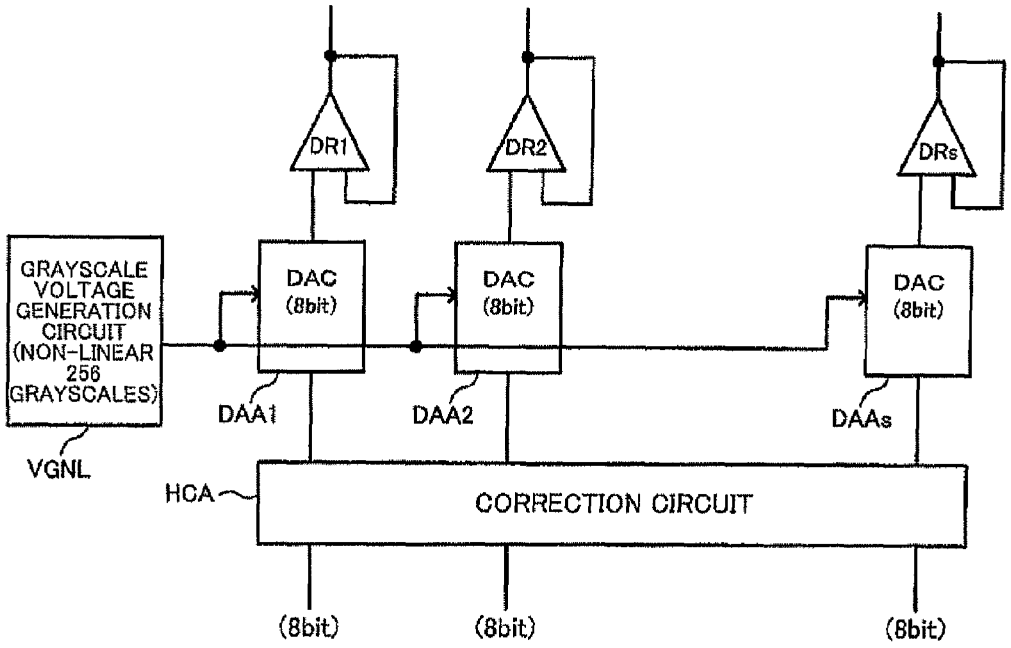
FIGS. 1A and 1B show comparative examples of one embodiment of the invention.

Several aspects of the invention may provide an integrated circuit device, an electronic instrument, and the like that implement high-quality image display.

According to one embodiment of the invention, there is provided an integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a plurality of D/A conversion circuits that are respectively provided corresponding to the plurality of data line driver circuits, each of the plurality of D/A conversion circuits receiving image data, and outputting an output signal that corresponds to the image data, each of the plurality of data line driver circuits including:

an operational amplifier;

an input capacitor that is provided between a summing node and an input node of the data line driver circuit, the summing node being connected to a first input terminal of the operational amplifier; and a first correction capacitor that is provided between the summing node and a first correction input node of the data line driver circuit, each of the plurality of D/A conversion circuits outputting the output signal to the input capacitor of the corresponding data line driver circuit among the plurality of data line driver circuits, and the first correction D/A conversion circuit outputting the first correction output signal to the first correction capacitors of the plurality of data line driver circuits to correct data signals output from the plurality of data line driver circuits.

According to this embodiment, each of the plurality of data line driver circuits includes the operational amplifier, the input capacitor, and the first correction capacitor. Each of the plurality of D/A conversion circuits receives the image data, and outputs the output signal (e.g., output voltage) that corresponds to the image data to the input capacitor, and the first correction D/A conversion circuit receives the first correction data, and outputs the first correction output signal (e.g., correction output voltage) that corresponds to the first correction data to the first correction capacitors to correct the data signals (e.g., data voltages) output from the plurality of data line driver circuits.

According to this embodiment, the first correction D/A conversion circuit outputs the first correction output signal that corresponds to the first correction data to the first correction capacitors. Therefore, the first correction D/A conversion circuit can output the first correction output signal and correct the data signals based on the first correction output signal by a step that differs from the grayscale-unit step of the output signals of the plurality of D/A conversion circuits. The image quality of the display image can be increased by thus correcting the data signals. For example, vertical luminance non-uniformity (i.e., a luminance error differs between the upper area and the lower area of the display image) (display non-uniformity) can be corrected by utilizing first correction data that changes every scan line or at intervals of a plurality of scan lines.

The integrated circuit device may further comprise:

a grayscale signal generation circuit that outputs a grayscale signal to the plurality of D/A conversion circuits, the grayscale signal having non-linear grayscale characteristics with respect to the image data; and a first correction signal generation circuit that outputs a first correction signal to the first correction D/A conversion circuit, the first correction signal having linear grayscale characteristics with respect to the first correction data.

According to this configuration, since the first correction signal generation circuit outputs the first correction signal (e.g., correction voltage) having linear grayscale characteristics with respect to the first correction data, the grayscale-unit step of the first correction output signal can be made uniform. This implements correction of the data signal by a regular voltage step. According to this configuration, the grayscale signal generation circuit outputs the grayscale signals (e.g., grayscale voltages) having non-linear grayscale characteristics with respect to the image data. This makes it unnecessary to provide a calculation circuit that performs a gamma correction process on the image data, so that an increase in circuit scale and power consumption can be prevented.

The integrated circuit device may further comprise:

a control circuit that outputs the first correction data to the first correction D/A conversion circuit, the control circuit may output the first correction data while changing the first correction data every scan line or at intervals of a plurality of scan lines.

According to this configuration, a first correction output signal that changes every scan line or at intervals of a plurality of scan lines can be output by changing the first correction data every scan line or at intervals of a plurality of scan lines. This enables the data signals to be corrected by a first correction output signal that changes every scan line or at intervals of a plurality of scan lines.

In the integrated circuit device, the control circuit may include a line count setting register, a number of scan lines being set in the line count setting register, the first correction data being changed at intervals of the number of scan lines set in the line count setting register.

According to this configuration, the number of scan lines can be set in the line count setting register, the first correction data being changed at intervals of the number of scan lines set in the line count setting register. Therefore, the control circuit can change the first correction data at intervals of the number of scan lines set in the line count setting register.

In the integrated circuit device, the control circuit may include a change width setting register, a change width when changing the first correction data being set in the change width setting register.

According to this configuration, the change width when changing the first correction data can be set in the change width setting register. Therefore, the control circuit can change the first correction data by the change width set in the change width setting register.

The integrated circuit device may further comprise:

a control circuit that outputs the first correction data to the first correction D/A conversion circuit, the control circuit may include a chip-to-chip variation correction register that stores chip-to-chip variation correction data, and the first correction D/A conversion circuit may correct a chip-to-chip variation in the data signals output from the plurality of data line driver circuits based on the chip-to-chip variation correction data.

According to this configuration, the chip-to-chip variation correction data can be stored in the chip-to-chip variation correction register. Therefore, the first correction D/A conversion circuit can correct a chip-to-chip variation in data signal (i.e., a variation in data signal between a plurality of integrated circuit devices) based on the chip-to-chip variation correction data stored in the chip-to-chip variation correction register, In the integrated circuit device, the control circuit may include an initial information storage circuit, the chip-to-chip variation correction data being set in the initial information storage circuit during production of the integrated circuit device; and the chip-to-chip variation correction register may store the chip-to-chip variation correction data that is read from the initial information storage circuit.

According to this configuration, the chip-to-chip variation correction data can be set in the initial information storage circuit during production of the integrated circuit device. The chip-to-chip variation correction data can be read from the initial information storage circuit, and stored in the chip-to-chip variation correction register.

In the integrated circuit device, each of the plurality of data line driver circuits may include:

a first switch element that is provided between the input node and a first node;

a second switch element that is provided between the first node and an reference power supply;

a feedback capacitor that is provided between the summing node and a second node;

a third switch element that is provided between the second node and an output node;

a fourth switch element that is provided between the second node and the analog reference power supply;

a fifth switch element that is provided between the summing node and the output node;

a first correction switch element that is provided between the first correction input node and a third node; and a second correction switch element that is provided between the third node and a first correction reference voltage node, a first correction reference voltage being supplied to the first correction reference voltage node, an analog reference power supply voltage may be supplied to a second input terminal of the operational amplifier, the output node may be connected to an output terminal of the operational amplifier, the input capacitor may be provided between the first node and the summing node, and the first correction capacitor may be provided between the third node and the summing node.

In the integrated circuit device, each of the plurality of data line driver circuits may include:

a first switch element that is provided between the input node and a first node;

a second switch element that is provided between the first node and an output node;

a third switch element that is provided between the summing node and the output node;

a first correction switch element that is provided between the first correction input node and a second node; and a second correction switch element that is provided between the second node and a first correction reference voltage node, a first correction reference voltage being supplied to the first correction reference voltage node, an analog reference power supply voltage may be supplied to a second input terminal of the operational amplifier, the output node may be connected to an output terminal of the operational amplifier, the input capacitor may be provided between the first node and the summing node, and the first correction capacitor may be provided between the second node and the summing node.

According to the above configuration, a data line driver circuit that includes an operational amplifier, an input capacitor, and a first correction capacitor can be implemented. Specifically, it is possible to implement a data line driver circuit in which the output signal from the D/A conversion circuit is input to the input capacitor, and the correction output signal from the first correction D/A conversion circuit is input to the first correction capacitor to output the corrected data signal.

The integrated circuit device may further comprise:

a plurality of second correction D/A conversion circuits, the plurality of second correction D/A conversion circuits being respectively provided corresponding to the plurality of data line driver circuits, each of the plurality of data line driver circuits may include a second correction capacitor that is provided between the summing node and a second correction input node of the data line driver circuit; and each of the plurality of second correction D/A conversion circuits may receive second correction data that corresponds to the corresponding data line driver circuit among the plurality of data line driver circuits, and may output a second correction output signal that corresponds to the second correction data to the second correction capacitor to correct the data signal output from the corresponding data line driver circuit.

According to this configuration, the data signals output from the plurality of data line driver circuits can be corrected by causing each of the plurality of second correction D/A conversion circuits to output the second correction output signal. Therefore, the data signals output from the plurality of data line driver circuits can be corrected independently. Moreover, each of the plurality of second correction D/A conversion circuits can output the second correction output signal and correct the data signal based on the second correction output signal by a step that differs from the grayscale-unit step of the output signals of the plurality of D/A conversion circuits.

The integrated circuit device may further comprise:

a grayscale signal generation circuit that outputs a grayscale signal to the plurality of D/A conversion circuits, the grayscale signal having non-linear grayscale characteristics with respect to the image data; and a second correction signal generation circuit that outputs a second correction signal to the plurality of second correction D/A conversion circuits, the second correction signal having linear grayscale characteristics with respect to the second correction data.

According to this configuration, since the second correction signal generation circuit outputs the second correction signal having linear grayscale characteristics with respect to the second correction data, the grayscale-unit step of the second correction output signal can be made uniform. This implements correction of the data signal by a regular voltage step.

According to another embodiment of the invention, there is provided an integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a second correction D/A conversion circuit that receives second correction data, and outputs a second correction output signal that corresponds to the second correction data, each of the plurality of data line driver circuits including:

an operational amplifier;

an input capacitor that is provided between a summing node and an input node of the data line driver circuit, the summing node being connected to a first input terminal of the operational amplifier; and a correction capacitor that is provided between the summing node and a correction input node of the data line driver circuit, a signal that is obtained by dividing a signal between the first correction output signal and the second correction output signal being input to the correction capacitor of each of the plurality of data line driver circuits.

According to this embodiment, each of the plurality of D/A conversion circuits receives the image data, and outputs the output signal (e.g., output voltage) that corresponds to the image data to the input capacitor, and the first and second correction D/A conversion circuits output the first and second correction output signals (e.g., correction output voltages) corresponding to the first and second correction data. A signal obtained by dividing a signal between the first correction output signal and the second correction output signal is input to the correction capacitor to correct the data signals (e.g., data voltages) output from the plurality of data line driver circuits.

According to this embodiment, the first and second correction D/A conversion circuits output the first and second correction output signals corresponding to the first and second correction data, and a signal obtained by dividing a signal between the first correction output signal and the second correction output signal is input to the correction capacitor. Therefore, since a signal that slopes with respect to the order of the data lines is input to the correction capacitor, a variation in data signal that slopes with respect to the order of the data lines can be corrected, According to another embodiment of the invention, there is provided an integrated circuit device comprising:

a plurality of data line driver circuits, each of the plurality of data line driver circuits driving a corresponding data line among a plurality of data lines;

a plurality of correction D/A conversion circuits that are respectively provided corresponding to the plurality of data line driver circuits; and a plurality of D/A conversion circuits that are respectively provided corresponding to the plurality of data line driver circuits, each of the plurality of data line driver circuits including:

an operational amplifier;

an input capacitor that is provided between a summing node and an input node of the data line driver circuit, the summing node being connected to a first input and a correction capacitor that is provided between the summing node and a correction input node of the data line driver circuit, each of the plurality of D/A conversion circuits receiving image data, and outputting an output signal that corresponds to the image data to the input capacitor of the corresponding data line driver circuit among the plurality of data line driver circuits, and each of the plurality of correction D/A conversion circuits receiving correction data that corresponds to the corresponding data line driver circuit among the plurality of data line driver circuits, and outputting a correction output signal that corresponds to the correction data to the correction capacitor to correct a data signal output from the corresponding data line driver circuit.

According to this embodiment, each of the plurality of data line driver circuits includes the operational amplifier, the input capacitor, and the correction capacitor. Each of the plurality of D/A conversion circuits outputs the output signal (e.g., output voltage) that corresponds to the image data to the input capacitor, and each of the plurality of correction D/A conversion circuits outputs the correction output signal (e.g., correction output voltage) that corresponds to the correction data to the correction capacitor to correct the data signals (e.g., data voltages) output from the plurality of data line driver circuits.

According to this embodiment, the data signals output from the plurality of data line driver circuits can be corrected by causing each of the plurality of correction D/A conversion circuits to output the correction output signal. Therefore, the data signals output from the plurality of data line driver circuits can be corrected independently. Moreover, each of the plurality of correction D/A conversion circuits can output the correction output signal and correct the data signal based on the correction output signal by a step that differs from the grayscale-unit step of the output signals of the plurality of D/A conversion circuits.

According to another embodiment of the invention, there is provided an electronic instrument comprising one of the above integrated circuit devices.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Comparative Example

Figure 1B:
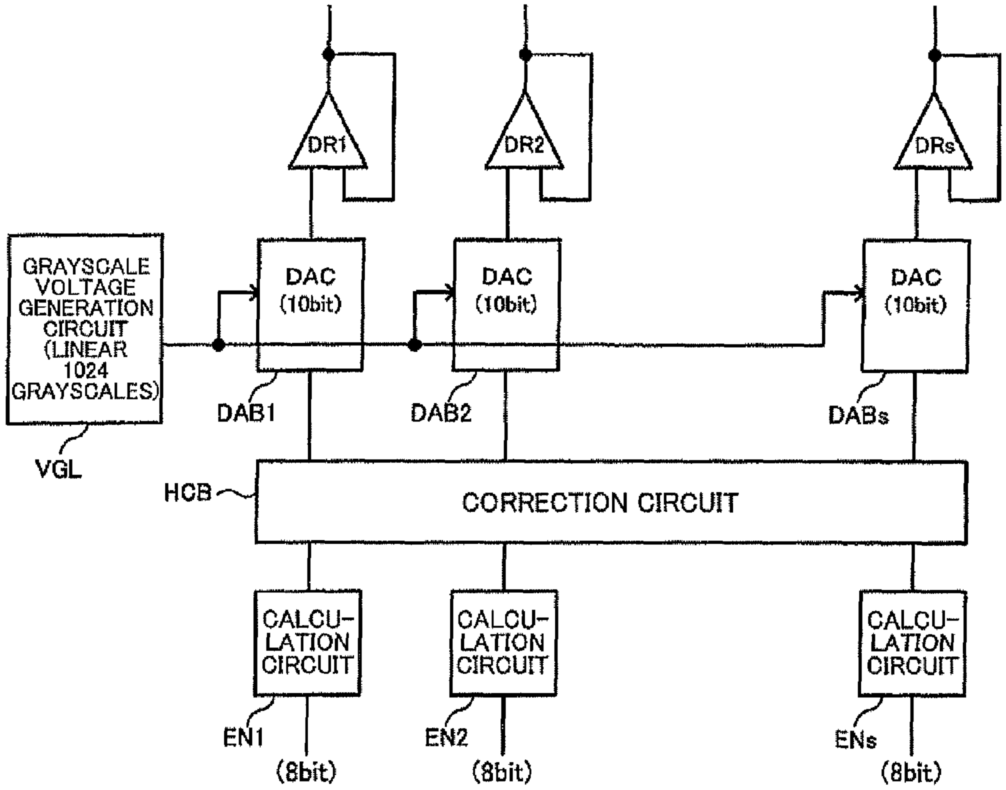

Comparative examples of one embodiment of the invention are described below with reference to FIGS. 1A and 1B. FIGS. 1A and 1B are block diagrams showing a data driver that corrects image data to correct display non-uniformity of a liquid crystal display device (electro-optical device) as comparative examples of this embodiment.

In a first comparative example shown in FIG. 1A, a grayscale voltage generation circuit VGNL outputs grayscale voltages that are irregular (unequal-interval) with respect to image data. Specifically, a correction circuit HCA corrects 8-bit input image data, and outputs the corrected image data. The grayscale voltage generation circuit VGNL outputs 256 grayscale voltages that correspond to the gamma characteristics of the liquid crystal panel (electro-optical panel). Each of D/A conversion circuits DAA1 to DAAs (s is a natural number) receives the grayscale voltages and the corrected image data, and subjects the corrected image data to D/A conversion. Each of data line driver circuits DR1 to DRs receives a data voltage obtained by D/A conversion, and drives a data line of the liquid crystal panel.

In the first comparative example, the corrected image data is subjected to D/A conversion using the grayscale voltages that are irregular with respect to the image data. Therefore, since the grayscale-unit voltage step (voltage difference) differs corresponding to the grayscale value of the image data, the data voltage cannot be corrected by a regular (equal-interval) voltage step.

In a second comparative example shown in FIG. 1B, a grayscale voltage generation circuit VGL outputs grayscale voltages that are regular (equal-interval) with respect to image data. Specifically, each of calculation circuits EN1 to ENs receives 8-bit input image data, extends the input image data to 10-bit data in order to represent a gamma curve using a regular grayscale voltage, and performs a calculation process (e.g., gamma correction) on the resulting image data. A correction circuit HCB corrects display non-uniformity of the image data subjected to the calculation process, and outputs the corrected image data. Each of D/A conversion circuits DAB1 to DABs receives the grayscale voltages and the corrected image data, and subjects the corrected image data to D/A conversion. Each of data line driver circuits DR1 to DRs receives a data voltage obtained by D/A conversion, and drives a data line of the liquid crystal panel.

In the second comparative example, since the corrected image data is subjected to D/A conversion using the grayscale voltages that are regular with respect to the image data, the data voltage can be corrected by a regular voltage step. In the second comparative example, however, the input image data is extended to 10-bit data in order to represent a gamma curve using the regular grayscale voltages, and the 10-bit image data is subjected to D/A conversion. This makes it necessary to additionally provide the calculation circuits EN1 to ENs and the 10-bit D/A conversion circuits DAB1 to DABs. Therefore, the circuit scale increases. Moreover, the calculation circuits EN1 to ENs increase power consumption.

2. Integrated Circuit Device 2.1. First Configuration Example

Figure 2:
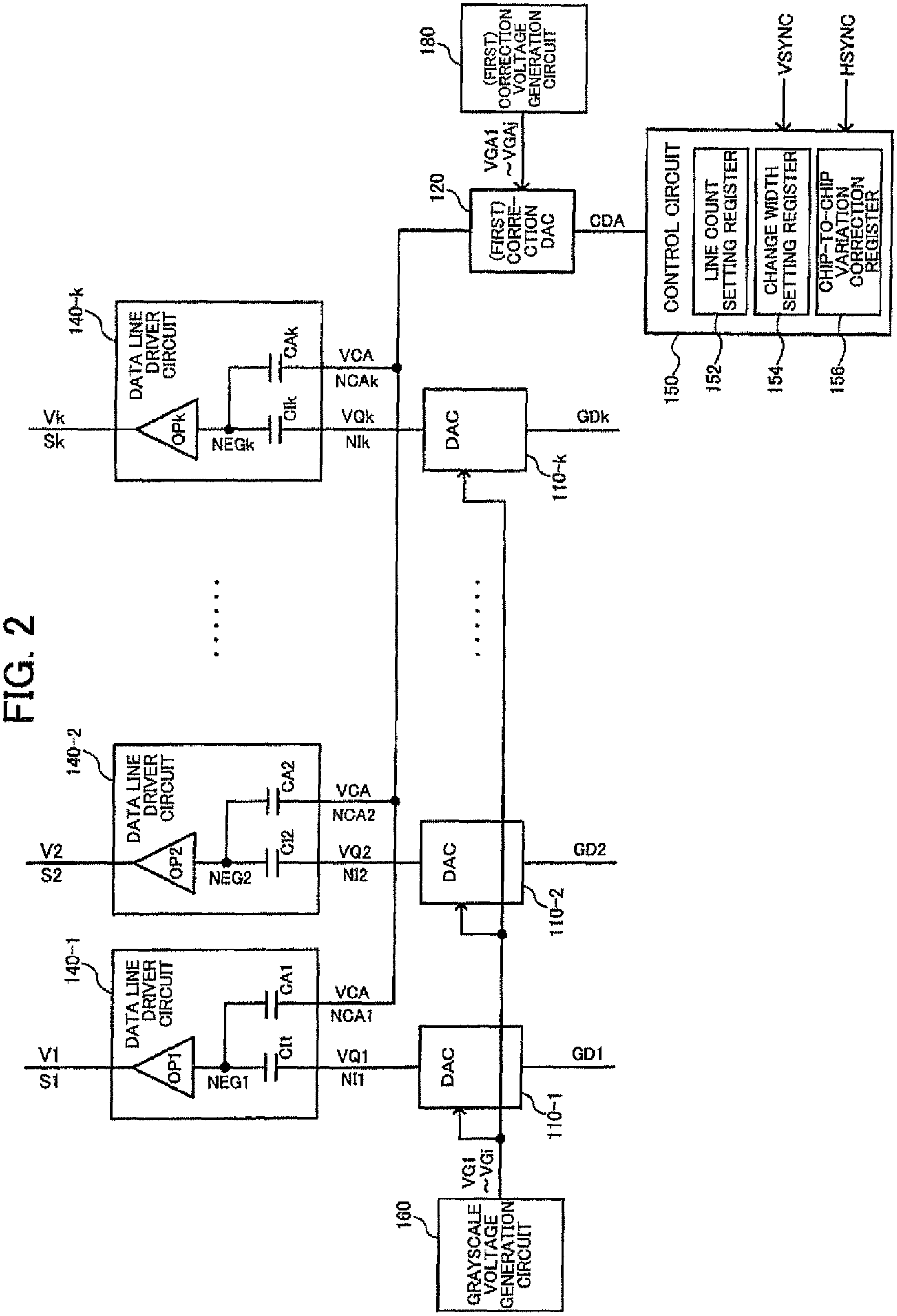
FIG. 2 shows a first configuration example of an integrated circuit device according to one embodiment of the invention.

FIG. 2 shows an integrated circuit device according to a first configuration example of this embodiment that can solve the above problems. The integrated circuit device according to the first configuration example shown in FIG. 2 includes first to kth D/A conversion circuits 110-1 to 110-*k* (i.e., a plurality of D/A conversion circuits; k is a natural number), a correction D/A conversion circuit 120 (i.e., first correction D/A conversion circuit), first to kth data line driver circuits 140-1 to 140-*k* (i.e., a plurality of data line driver circuits), a control circuit 150, a grayscale voltage generation circuit 160 (grayscale signal generation circuit in a broad sense), and a correction voltage generation circuit 180 (first correction signal generation circuit in a broad sense). Note that the integrated circuit device according to the invention is not limited to the configuration shown in FIG. 2. Various modifications may be made, such as omitting some (e.g., control circuit 150, grayscale voltage generation circuit 160, or correction voltage generation circuit 180) of the elements or adding other elements.

The following description illustrates an example in which signals (e.g., data signal, grayscale signal, correction signal, output signal, and correction output signal) are voltage signals (e.g., data voltage, grayscale voltage, correction voltage, output voltage, and correction output voltage). Note that these signals may be current signals (e.g., data current, grayscale current, correction current, output current, and correction output current).

In the first configuration example, the correction D/A conversion circuit 120 outputs a correction output voltage VCA (first correction output signal in a broad sense) to correct first to kth data voltages V1 to Vk (data signals in a broad sense).

Specifically, the grayscale voltage generation circuit 160 (reference voltage generation circuit) generates grayscale voltages VG1 to VGi (grayscale signals in a broad sense; i is a natural number) that are supplied to the D/A conversion circuits 110-1 to 110-*k*. For example, the grayscale voltage generation circuit 160 includes a resistor ladder, and divides a power supply voltage that is supplied from a power supply circuit (e.g., a power supply circuit 50 shown in FIG. 19 (described later)) using the resistors to output the grayscale voltages VG1 to VGi.

The D/A conversion circuits 110-1 to 110-*k* (digital-to-analog converters (DACs)) respectively receive image data GD1 to GDk (grayscale data), subject the image data GD1 to GDk to D/A conversion, and output output voltages VQ1 to VQk (output signals in a broad sense). The D/A conversion circuits 110-1 to 110-*k* implement D/A conversion by selecting grayscale voltages that respectively correspond to the image data GD1 to GDk from the grayscale voltages VG1 to VGi.

The correction voltage generation circuit 180 generates correction voltages VGA1 to VGAj (first correction signals in a broad sense; j is a natural number) that are supplied to the correction D/A conversion circuit 120. For example, the correction voltage generation circuit 180 includes a resistor ladder, and divides a power supply voltage supplied from a power supply circuit (e.g., the power supply circuit 50 shown in FIG. 19 (described later)) using the resistors to output the correction voltages VGA1 to VGAj (grayscale correction voltages).

The correction D/A conversion circuit 120 receives correction data CDA (first correction data), subjects the correction data CDA to D/A conversion, and outputs a correction output voltage VCA generated by D/A conversion. The correction D/A conversion circuit 120 implements D/A conversion by selecting a correction voltage that corresponds to the correction data CDA from the correction voltages VGA1 to VGAj.

The data line driver circuits 140-1 to **140-*k* respectively receive the output voltages VQ1 to VQk and the correction output voltage VCA, and output the data voltages V1 to Vk to data lines S1 to Sk. Specifically, the data line driver circuits 140-1 to 140-*k*** respectively include operational amplifiers OP1 to OPk (operational amplifier circuits), input capacitors CI1 to CIk, and correction capacitors CA1 to CAk (first correction capacitors). The output voltages VQ1 to VQk are respectively supplied to the input capacitors CI1 to CIk (input capacitive elements), and the correction output voltage VCA is supplied to the correction capacitors CA1 to CAk (correction capacitive elements). The operational amplifiers OP1 to OPk respectively supply the data voltages V1 to Vk to the data lines S1 to Sk.

Specifically, the data lines S1 to Sk are respectively connected to output terminals of the operational amplifiers OP1 to OPk. Summing nodes NEG1 to NEGk are respectively connected to inverting input terminals (negative input terminals; first input terminals in a broad sense) of the operational amplifiers OP1 to OPk. The input capacitors CI1 to CIk are respectively provided between the summing nodes NEG1 to NEGk and input nodes NI1 to NIk. The correction capacitors CA1 to CAk are respectively provided between the summing nodes NEG1 to NEGk and correction input nodes NCA1 to NCAk (first correction input nodes).

The control circuit 150 outputs the correction data CDA to the correction D/A conversion circuit 120. The control circuit 150 includes a line count setting register 152, a change width setting register 154, and a chip-to-chip (die-to-die) variation correction register 156. A register value is set in each register from a host controller (not shown) (e.g., a display controller 40 shown in FIG. 19 (described later)), for example. The control circuit 150 generates the correction data CDA based on the register value set in each register.

Specifically, the number of scan lines is set in the line count setting register 152, and a change width (step or change value) of the correction data is set in the change width setting register 154. The control circuit 150 generates the correction data that changes (increases or decreases) by the change width set in the change width setting register 154 at intervals of the number of scan lines set in the line count setting register 152. The control circuit 150 generates the correction data based on a vertical synchronization signal VSYNC and a horizontal synchronization signal HSYNC supplied from a host controller (not shown) (e.g., the display controller 40 shown in FIG. 19 (described later)), for example. Correction data that corrects a chip-to-chip variation in data voltage (i.e., a variation in voltage between a plurality of drivers) is set in the chip-to-chip variation correction register 156. The control circuit 150 performs a calculation process (e.g., addition process) on the two pieces of correction data to generate the correction data CDA.

When the image data is corrected in order to correct display non-uniformity or the like, the data voltage can be corrected by only a voltage step that depends on the grayscale characteristics of the D/A conversion circuit. In the first comparative example, since the image data is subjected to D/A conversion using a grayscale voltage that is irregular with respect to the image data, the data voltage cannot be corrected by a regular voltage step. In the second comparative example, the image data is subjected to D/A conversion using a grayscale voltage that is regular with respect to the image data so that the data voltage can be corrected by a regular voltage step. However, the second comparative example requires a gamma correction calculation circuit and a D/A conversion circuit with an increased number of bits, so that the circuit scale and power consumption increase.

According to this embodiment, the D/A conversion circuits 110-1 to **110-*k* respectively receive the image data GD1 to GDk, and output the output voltages VQ1 to VQk that correspond to the image data GD1 to GDk. The correction D/A conversion circuit 120 receives the correction data CDA, and outputs the correction output voltage VCA that corresponds to the correction data CDA. The data line driver circuits 140-1 to 140-*k*** respectively receive the output voltages VQ1 to VQk and the correction output voltage VCA, and output the data voltages V1 to Vk.

According to this embodiment, the data voltages V1 to Vk output from the data line driver circuits 140-1 to **140-*k* can be corrected by causing the correction D/A conversion circuit 120 to receive the correction data CDA and output the correction output voltage VCA that corresponds to the correction data CDA. Therefore, the correction D/A conversion circuit 120 can output the correction output voltage VCA to correct the data voltages V1 to Vk by a voltage step that differs from the grayscale-unit voltage step of the output voltages VQ1 to VQk from the D/A conversion circuits 110-1 to 110-*k***.

More specifically, the data line driver circuits 140-1 to **140-*k* respectively include the operational amplifiers OP1 to OPk, the input capacitors CI1 to CIk, and the correction capacitors CA1 to CAk. The D/A conversion circuits 110-1 to 110-*k* respectively output the output voltages VQ1 to VQk to the input capacitors CI1 to CIk, and the correction D/A conversion circuit 120** outputs the correction output voltage VCA to the correction capacitors CA1 to CAk to correct the data voltages V1 to Vk.

According to this embodiment, the data line driver circuits 140-1 to **140-*k* are implemented by providing the operational amplifiers OP1 to OPk, the input capacitors CI1 to CIk, and the correction capacitors CA1 to CAk, respectively. For example, the data line driver circuits 140-1 to 140-*k* may be formed by a configuration example of a data line driver circuit shown in FIGS. 13, 17**, etc. described later. The data voltages V1 to Vk can be corrected by inputting the correction output voltage VCA to the correction capacitors CA1 to CAk.

The integrated circuit device according to this embodiment may include the grayscale voltage generation circuit 160 that outputs the grayscale voltages VG1 to VGi having non-linear (unequal interval) grayscale characteristics with respect to the image data GD1 to GDk to the D/A conversion circuits 110-1 to **110-*k*, and the correction voltage generation circuit 180 that outputs the correction voltages VGA1 to VGAj having linear (equal interval) grayscale characteristics with respect to the correction data CDA to the correction D/A conversion circuit 120**.

Figure 3A:
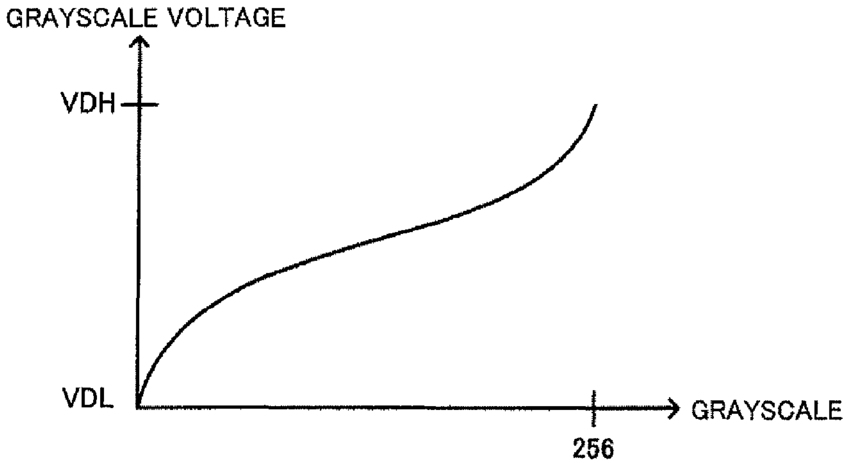
FIG. 3A shows an example of the grayscale characteristics of a grayscale voltage.
Figure 3B:
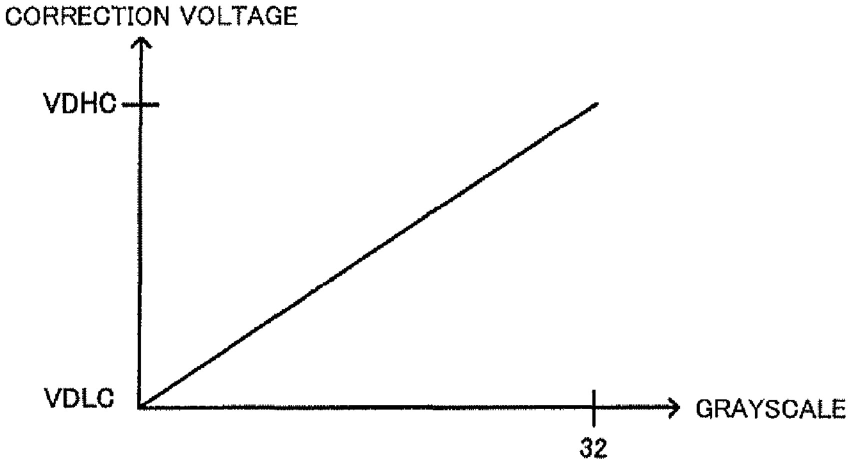
FIG. 3B shows an example of the grayscale characteristics of a correction voltage.

For example, the grayscale voltage generation circuit 160 may output grayscale voltages VG1 to VG256 (i=256) (256 grayscales) that correspond to the gamma characteristics of a liquid crystal panel (see FIG. 3A). The grayscale voltages VG1 to VG256 are generated by dividing the voltage between a high-potential-side power supply voltage VDH and a low-potential-side power supply voltage VDL into irregular voltages using an irregular resistor ladder. The correction voltage generation circuit 180 may output correction voltages VGA1 to VGA32 (j=32) (128 grayscales) that are linear with respect to the grayscales of the correction data CDA (see FIG. 3B). The correction voltages VGA1 to VGA32 are generated by dividing the voltage between a high-potential-side power supply voltage VDHC and a low-potential-side power supply voltage VDLC into regular voltages using a regular resistor ladder.

According to this embodiment, the grayscale-unit voltage step of the correction output voltage VCA can be made equal by causing the correction voltage generation circuit 180 to output the grayscale voltages VGA1 to VGAj having linear grayscale characteristics with respect to the correction data CDA. This implements correction of the data voltage by a regular voltage step that cannot be implemented by the first comparative example. According to this embodiment, it is unnecessary to perform a gamma correction process on the image data and increase the number of bits of the image data by causing the grayscale voltage generation circuit 160 to output the grayscale voltages VG1 to VGi having non-linear grayscale characteristics with respect to the image data GD1 to GDk. This makes it unnecessary to provide a calculation circuit and increase the number of bits of the D/A conversion circuit, differing from the second comparative example. This prevents an increase in circuit scale and power consumption.

The integrated circuit device according to this embodiment may include the control circuit 150 that outputs the correction data CDA to the correction D/A conversion circuit 120. The control circuit 150 may output the correction data CDA while changing the correction data CDA every scan line or at intervals of a plurality of scan lines.

If the control circuit 150 changes the correction data CDA every scan line or at intervals of a plurality of scan lines, a correction output voltage VCA that changes every scan line or at intervals of a plurality of scan lines is output. This enables the data voltages V1 to Vk to be corrected by a voltage value that changes every scan line or at intervals of a plurality of scan lines.

Figure 4:
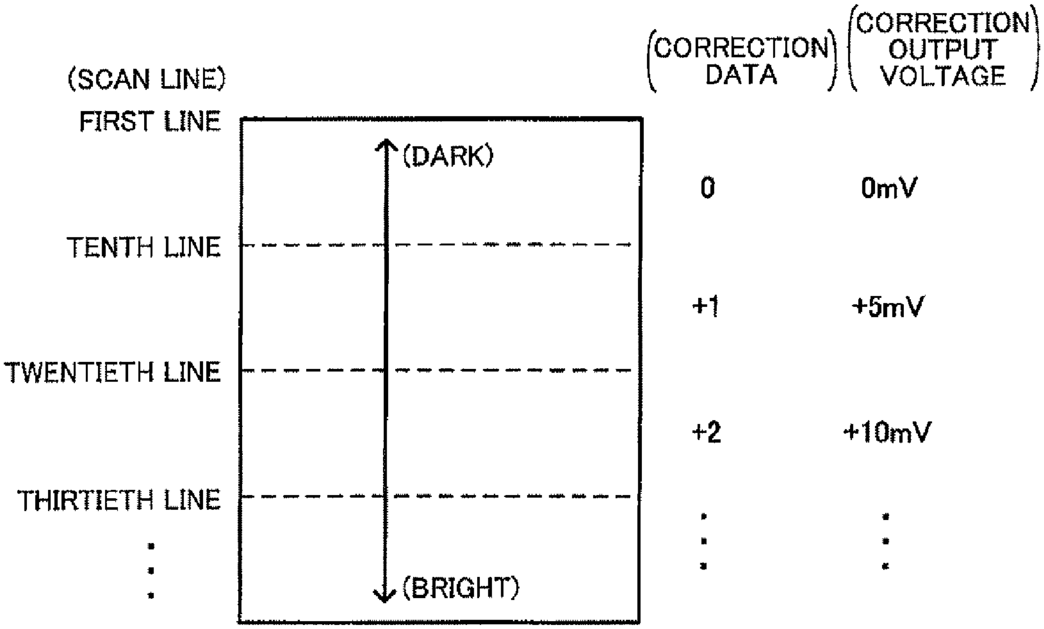
FIG. 4 is a view illustrative of correction of vertical luminance non-uniformity.

As shown in FIG. 4, a display image may be darkly displayed (i.e., may have a negative luminance error) in the upper area (i.e., the line number of the scan line is small), and may be brightly displayed (i.e., may have a positive luminance error) in the lower area (i.e., the line number of the scan line is large), for example. Such a vertical luminance non-uniformity occurs in a thin film transistor (TFT) liquid crystal panel since the period of time in which the data voltage written into the pixel leaks through the TFT increases in the upper area of the display image in which the data voltage is written earlier. According to this embodiment, such a vertical luminance non-uniformity can be corrected by changing the correction output voltage VCA every scan line or at intervals of a plurality of scan lines.

In this embodiment, the control circuit 150 may include the line count setting register 152, the number of scan lines being set in the line count setting register 152, the correction data CDA being changed at intervals of the number of scan lines set in the line count setting register 152.

According to this configuration, the number of scan lines can be set in the line count setting register 152, the correction data CDA being changed at intervals of the number of scan lines set in the line count setting register 152. Therefore, the control circuit 150 can change the correction data CDA at intervals of the number of scan lines set in the line count setting register 152. As shown in FIG. 4, when the number of scan lines is set to "10", it is possible to output correction data that changes at intervals of ten scan lines, for example. In the invention, the correction data may be changed at intervals of a plurality of scan lines by setting two or more to be the number of scan lines set in the line count setting register 152, or may be changed every scan line by setting one to be the number of scan lines set in the line count setting register 152.

In this embodiment, the control circuit 150 may include the change width setting register 154, the change width when changing the correction data CDA being set in the change width setting register 154.

According to this configuration, the change width when changing the correction data CDA can be set in the change width setting register 154. Therefore, the control circuit 150 can change the correction data CDA by the change width set in the change width setting register 154. As shown in FIG. 4, when the change width when changing the correction data CDA is "+1", it is possible to output correction data that changes by "+1" at intervals of ten scan lines, for example. This makes it possible to output the correction output voltage VCA that changes by "+5 mV" at intervals of ten scan lines, for example, so that vertical luminance non-uniformity can be corrected by the correction output voltage VCA.

In this embodiment, the control circuit 150 may include the chip-to-chip variation correction register 156 that stores chip-to-chip variation correction data, and the correction D/A conversion circuit 120 may correct a chip-to-chip variation in the data voltages V1 to Vk output from the data line driver circuits 140-1 to **140-*k*** based on the chip-to-chip variation correction data.

Figure 5A:
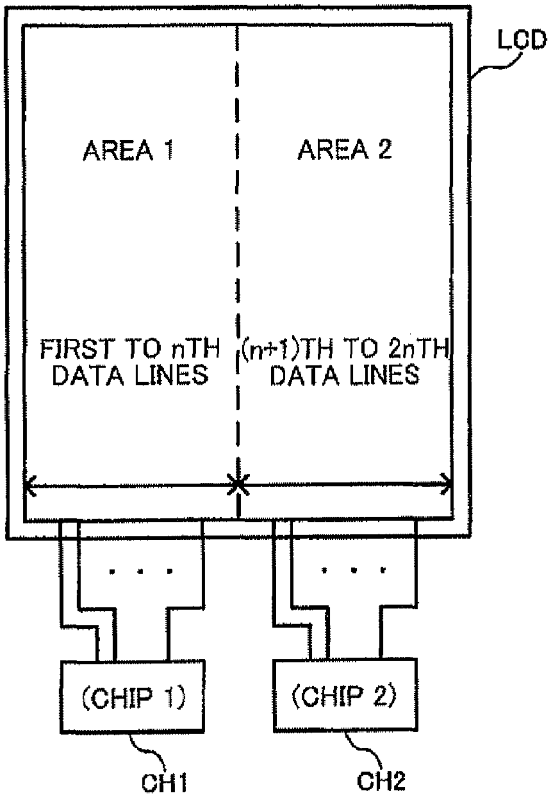
FIGS. 5A and 5B are views illustrative of correction of a chip-to-chip variation.
Figure 5B:
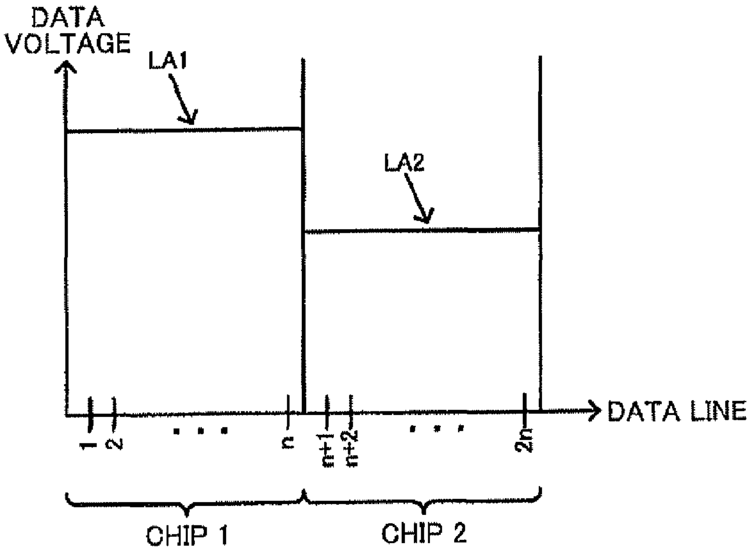

According to this configuration, the chip-to-chip variation correction data can be stored in the chip-to-chip variation correction register 156. Therefore, the correction D/A conversion circuit 120 can correct a chip-to-chip variation in data voltage based on the chip-to-chip variation correction data stored in the chip-to-chip variation correction register 156. The details are described below with reference to FIGS. 5A and 5B. As shown in FIG. 5A, a liquid crystal panel LCD (electro-optical panel) is driven by a first chip CH1 and a second chip CH2 (drivers; integrated circuit devices in a broad sense), for example. As shown in FIG. 5B, a data voltage (LA1) of the chip CH1 and a data voltage (LA2) of the chip CH2 corresponding to image data that corresponds to an identical grayscale may differ due to a production variation between the chips CH1 and CH2 and the like. According to this embodiment, even if a variation in data voltage occurs between a plurality of chips, the chip-to-chip variation can be corrected by the chip-to-chip variation correction data.

In this embodiment, the control circuit 150 may include an initial information storage circuit, the chip-to-chip variation correction data being set in the initial information storage circuit during production of the integrated circuit device, and the chip-to-chip variation correction register 156 may store the chip-to-chip variation correction data read from the initial information storage circuit. The initial information storage circuit may be formed by an electrically erasable programmable read only memory (EEPROM), for example. The chip-to-chip variation correction data may be stored in the EEPROM during production of the integrated circuit device.

According to this configuration, the chip-to-chip variation correction data can be set in the initial information storage circuit during production of the integrated circuit device. The chip-to-chip variation correction data can be read from the initial information storage circuit, and stored in the chip-to-chip variation correction register.

2.2. Second Configuration Example

Figure 6:
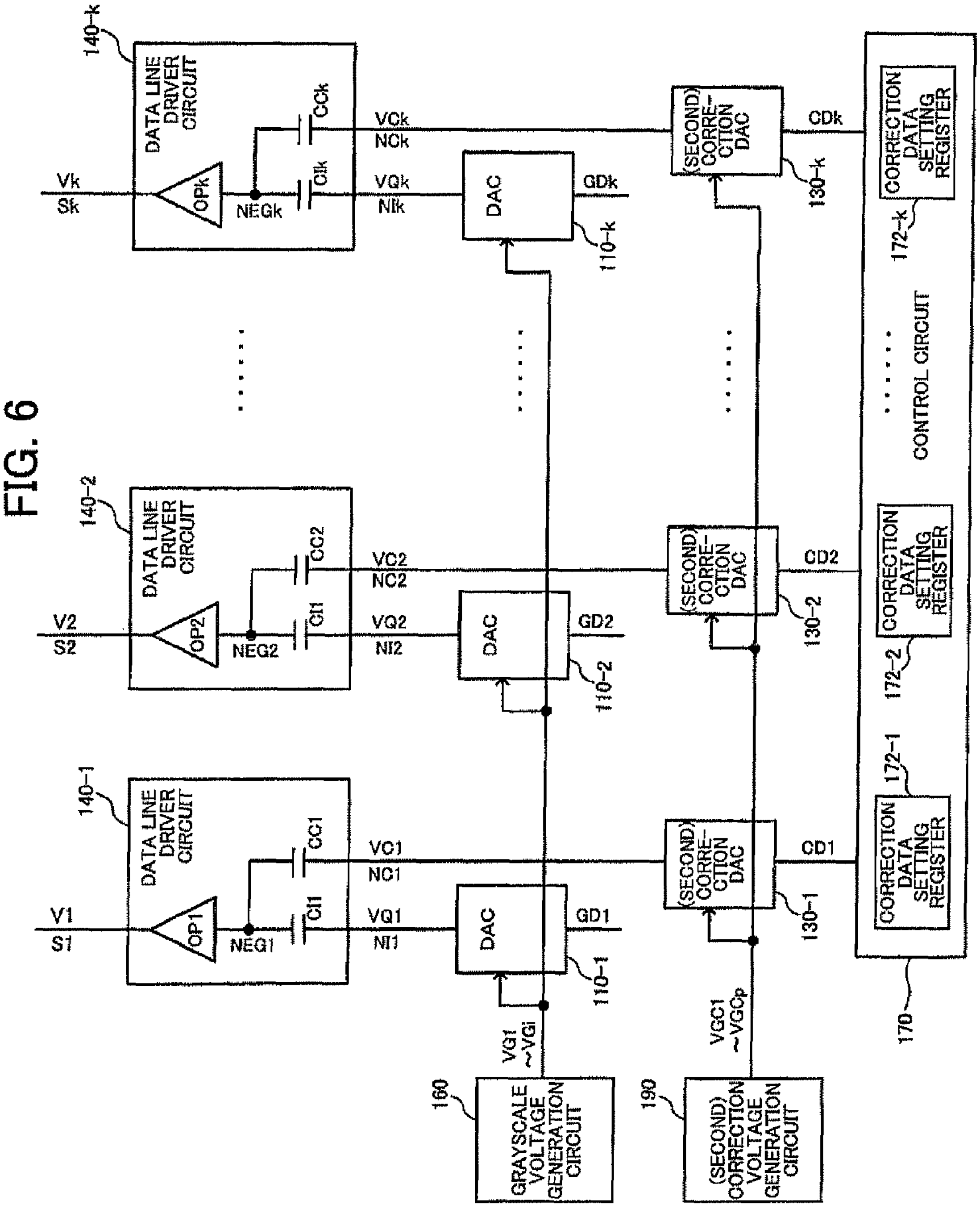
FIG. 6 shows a second configuration example of an integrated circuit device according to one embodiment of the invention.

FIG. 6 shows an integrated circuit device according to a second configuration example of this embodiment. The integrated circuit device according to the second configuration example shown in FIG. 6 includes the D/A conversion circuits 110-1 to **110-*k*, correction D/A conversion circuits 130-1 to 130-*k* (i.e., a plurality of second correction D/A conversion circuits), the data line driver circuits 140-1 to 140-*k*, the grayscale voltage generation circuit 160, a correction voltage generation circuit 190 (second correction signal generation circuit in a broad sense), and a control circuit 170. Note that the same elements (e.g., D/A conversion circuit) as the elements described with reference to FIG. 2** etc. are indicated by the same symbols. Description of these elements is appropriately omitted.

In the second configuration example, the correction D/A conversion circuits 130-1 to 130-*k* respectively output correction output voltages VC1 to VCk (second correction output signals in a broad sense) to correct the data voltages V1 to Vk.

Specifically, the correction voltage generation circuit 190 generates correction voltages VGC1 to VGCp (second correction signals in a broad sense; p is a natural number) supplied to the correction D/A conversion circuits 130-1 to 130-*k*. For example, the correction voltage generation circuit 190 includes a resistor ladder, and divides a power supply voltage supplied from a power supply circuit (e.g., the power supply circuit 50 shown in FIG. 19 (described later)) using the resistors to output the correction voltages VGC1 to VGCp (grayscale correction voltages).

The correction D/A conversion circuits 130-1 to 130-*k* respectively receive correction data CD1 to CDk (second correction data), subject the correction data CD1 to CDk to D/A conversion, and output the correction output voltages VC1 to VCk generated by D/A conversion. The correction D/A conversion circuits 130-1 to 130-*k* implement D/A conversion by selecting correction voltages that respectively correspond to the correction data CD1 to CDk from the correction voltages VGC1 to VGCp.

The data line driver circuits 140-1 to 140-*k* respectively receive the output voltages VQ1 to VQk from the D/A conversion circuits 110-1 to 110-*k* and the correction output voltages VC1 to VCk from the correction D/A conversion circuits 130-1 to 130-*k*, and output the data voltages V1 to Vk to the data lines S1 to Sk. Specifically, the data line driver circuits 140-1 to 140-*k* respectively include the operational amplifiers OP1 to OPk, the input capacitors CI1 to CIk, and correction capacitors CC1 to CCk (second correction capacitors). The correction output voltages VC1 to VCk are supplied to the correction capacitors CC1 to CCk. The correction capacitors CC1 to CCk are respectively provided between the summing nodes NEG1 to NEGk and correction input nodes NC 1 to NCk (second correction input nodes).

The output voltages VQ1 to VQk are respectively supplied to the input capacitors CI1 to CIk in the same manner as in the first configuration example. The input capacitors CI1 to CIk are respectively provided between the summing nodes NEG1 to NEGk and the input nodes NI1 to NIk. The summing nodes NEG1 to NEGk are respectively connected to the inverting input terminals of the operational amplifiers OP1 to OPk.

The control circuit 170 outputs correction data CD1 to CDk respectively to the correction D/A conversion circuits 130-1 to 130-*k*. The control circuit 170 includes correction data setting registers 172-1 to 172-*k*. Correction data CD1 to CDk is respectively set in the correction data setting registers 172-1 to 172-*k* from a host controller (not shown) (e.g., the display controller 40 shown in FIG. 19 (described later)), for example. The control circuit 170 outputs the correction data CD1 to CDk set in the correction data setting registers 172-1 to 172-*k* respectively to the correction D/A conversion circuits 130-1 to 130-*k*.

According to the second configuration example of this embodiment, the D/A conversion circuits 110-1 to 110-*k* respectively receive the image data GD1 to GDk, and output the output voltages VQ1 to VQk that correspond to the image data GD1 to GDk. The correction D/A conversion circuits 130-1 to 130-*k* respectively receive the correction data CD1 to CDk, and output the correction output voltages VC1 to VCk that correspond to the correction data CD1 to CDk. The data line driver circuits 140-1 to 140-*k* respectively receive the output voltages VQ1 to VQk and the correction output voltages VC1 to VCk, and output the data voltages V1 to Vk.

According to this configuration, the data voltages V1 to Vk respectively output from the data line driver circuits 140-1 to 140-*k* can be corrected by causing the correction D/A conversion circuits 130-1 to 130-*k* to respectively output the correction output voltages VC1 to VCk. Therefore, the data voltages V1 to Vk can be corrected independently (individually). The correction D/A conversion circuits 130-1 to 130-*k* can output the correction output voltages VC1 to VCk to correct the data voltages V1 to Vk by a voltage step that differs from the grayscale-unit voltage step of the output voltages VQ1 to VQk from the D/A conversion circuits 110-1 to 110-*k*.

For example, display non-uniformity (vertical line non-uniformity) may occur in a liquid crystal display device due to a liquid crystal panel (e.g., production variation). According to this embodiment, since the data voltages V1 to Vk can be corrected independently, display non-uniformity due to the liquid crystal panel can be corrected by adjusting the correction data corresponding to the display non-uniformity of the liquid crystal panel.

The integrated circuit device according to this embodiment may include the grayscale voltage generation circuit 160 that outputs the grayscale voltages VG1 to VGi having non-linear grayscale characteristics with respect to the image data GD1 to GDk to the D/A conversion circuits 110-1 to 110-*k*, and the correction voltage generation circuit 190 that outputs the correction voltages VGC1 to VGCp having linear grayscale characteristics with respect to the correction data GD1 to GDk to the correction D/A conversion circuits 130-1 to 130-*k*.

This implements correction of the data voltage by a regular voltage step in the same manner as in the first configuration example by causing the correction voltage generation circuit 190 to output the correction voltages VGC1 to VGCp having linear grayscale characteristics with respect to the correction data GD1 to GDk. Since it is unnecessary to provide a calculation circuit and increase the number of bits of the D/A conversion circuit by causing the grayscale voltage generation circuit 160 to output the grayscale voltages VG1 to VGi having non-linear grayscale characteristics with respect to the image data GD1 to GDk, an increase in circuit scale and power consumption can be prevented.

2.3. Third Configuration Example

Figure 7:
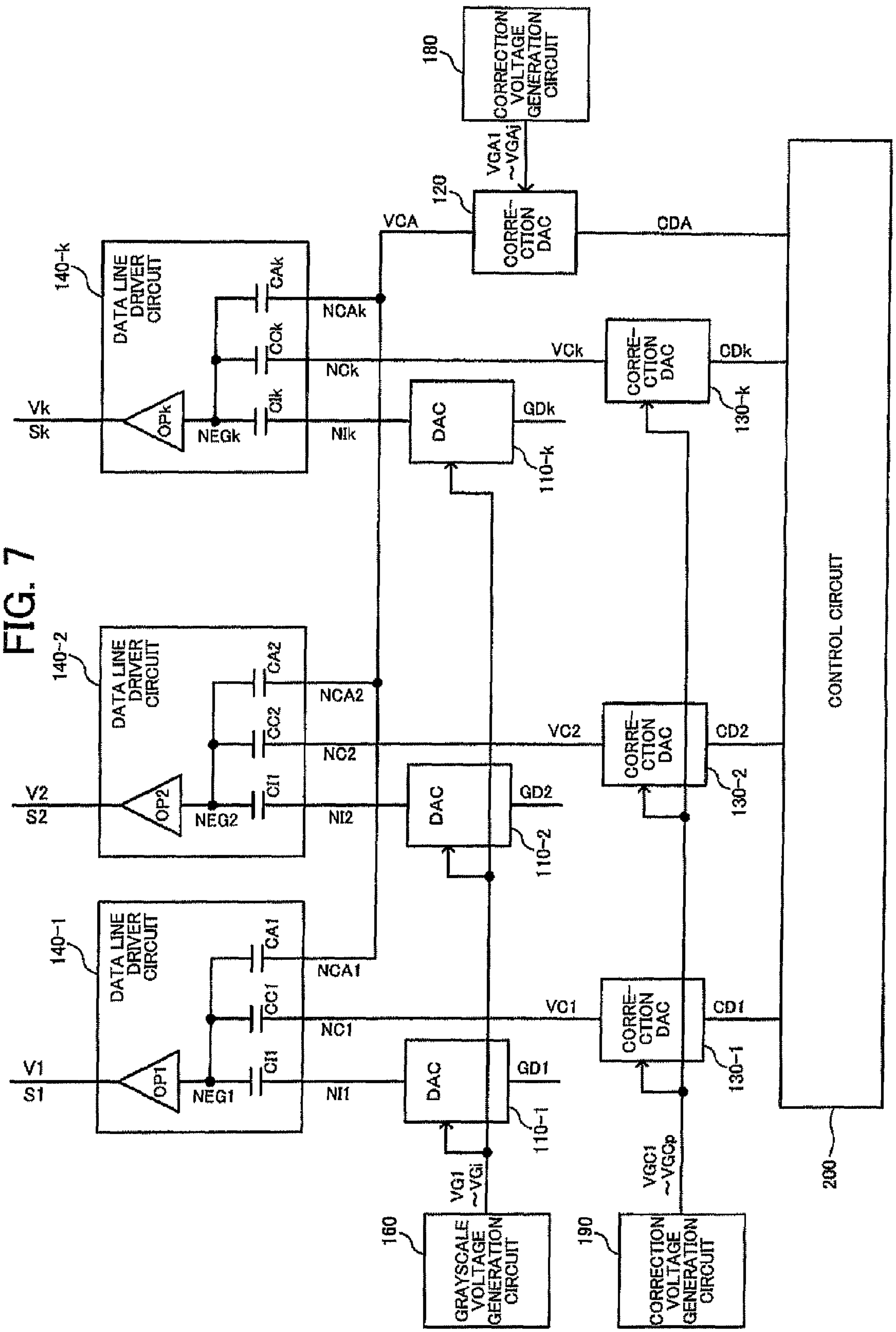
FIG. 7 shows a third configuration example of an integrated circuit device according to one embodiment of the invention.

FIG. 7 shows an integrated circuit device according to a third configuration example of this embodiment. The integrated circuit device according to the third configuration example shown in FIG. 7 includes the D/A conversion circuits 110-1 to 110-*k*, the correction D/A conversion circuit 120, the correction D/A conversion circuits 130-1 to 130-*k*, the data line driver circuits 140-1 to 140-*k*, the grayscale voltage generation circuit 160, the correction voltage generation circuit 180, the correction voltage generation circuit 190, and a control circuit 200. Note that the same elements (e.g., D/A conversion circuit) as the elements described with reference to FIG. 2 etc. are indicated by the same symbols. Description of these elements is appropriately omitted.

In the third configuration example, the data voltages V1 to Vk are corrected based on the correction output voltage VCA output from the correction D/A conversion circuit 120 and the correction output voltages VC1 to VCk respectively output from the correction D/A conversion circuits 130-1 to 130-*k*.

Specifically, the data line driver circuits 140-1 to 140-*k* respectively include the operational amplifiers OP1 to OPk, the input capacitors CI1 to CIk, the correction capacitors CA1 to CAk, and the correction capacitors CC1 to CCk. The correction voltage generation circuit 180 outputs the correction voltages VGA1 to VGAj to the correction D/A conversion circuit 120. The correction D/A conversion circuit 120 subjects the correction data CDA to D/A conversion, and outputs the correction output voltage VCA to the correction capacitors CA1 to CAk. The correction voltage generation circuit 190 outputs the correction voltages VGC1 to VGCp to the correction D/A conversion circuits 130-1 to **130-*k*. The correction D/A conversion circuits 130-1 to 130-*k* respectively subject the correction data CD1 to CDk to D/A conversion, and output the correction output voltages VC1 to VCk to the correction capacitors CC1 to CCk. The operational amplifiers OP1 to OPk respectively output the data voltages V1 to Vk to the data lines S1 to Sk. The control circuit 200 outputs the correction data CDA to the correction D/A conversion circuit 120, and outputs the correction data CD1 to CDk to the correction D/A conversion circuits 130-1 to 130-*k*. The control circuit 200 may include the line count setting register, the change width setting register, and the chip-to-chip variation correction register described with reference to FIG. 2 etc., and may also include the correction data setting register described with reference to FIG. 2** etc.

Since the integrated circuit device according to the third configuration example of the invention includes the correction D/A conversion circuit 120, the data voltages V1 to Vk can be corrected every scan line or at intervals of a plurality of scan lines. This makes it possible to correct display non-uniformity such as vertical luminance non-uniformity. Since the integrated circuit device according to the third configuration example of the invention includes the correction D/A conversion circuits 130-1 to **130-*k***, the data voltages V1 to Vk can be corrected corresponding to each data line. This makes it possible to correct display non-uniformity such as vertical line non-uniformity.

2.4. Fourth Configuration Example

Figure 8:
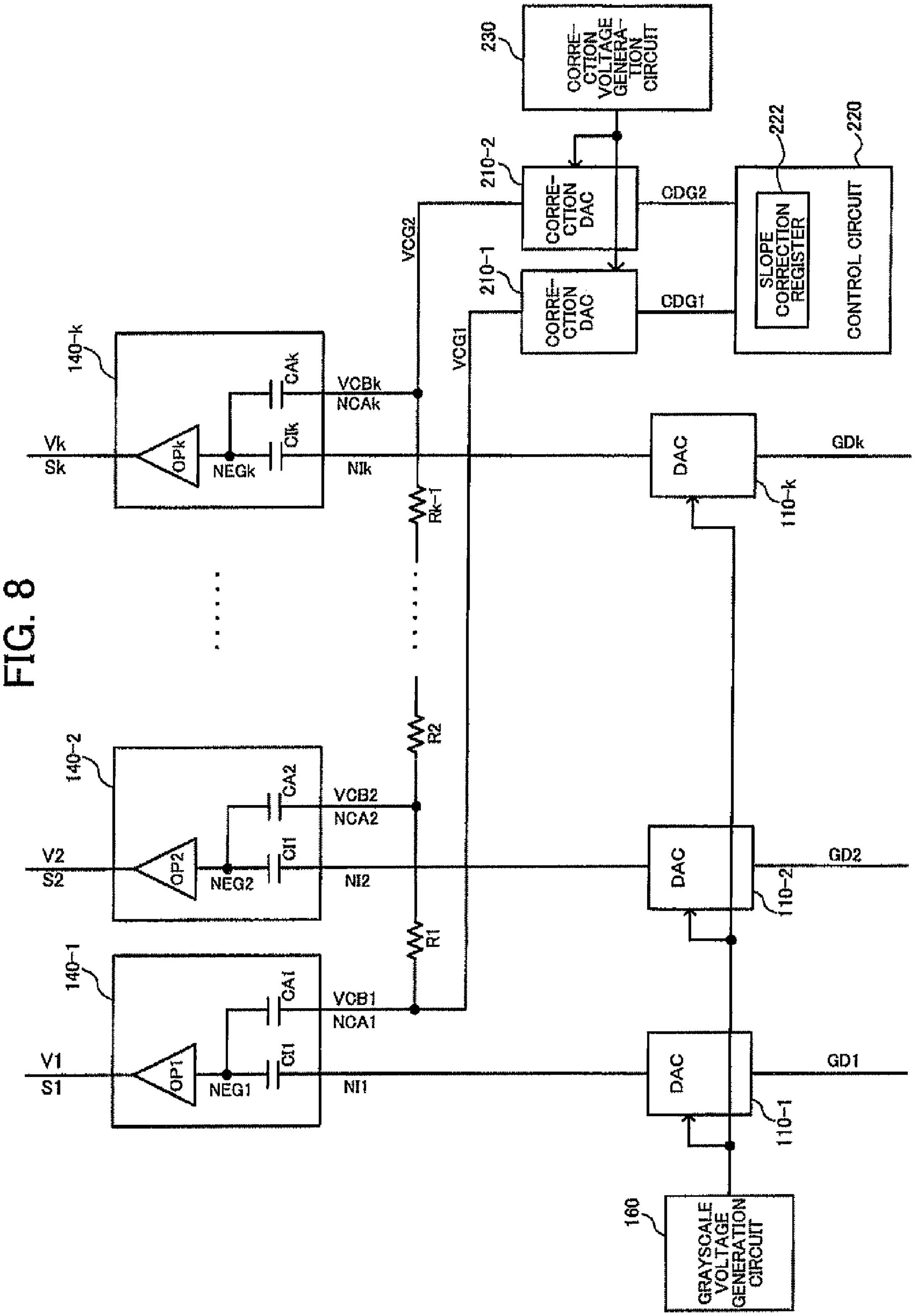
FIG. 8 shows a fourth configuration example of an integrated circuit device according to one embodiment of the invention.

FIG. 8 shows an integrated circuit device according to a fourth configuration example of this embodiment. The integrated circuit device according to the fourth configuration example shown in FIG. 8 includes the D/A conversion circuits 110-1 to **110-*k*, the grayscale voltage generation circuit 160, correction D/A conversion circuits 210-1 and 210-2 (first and second correction D/A conversion circuits), a control circuit 220, and a correction voltage generation circuit 230 (correction signal generation circuit in a broad sense). Note that the same elements (e.g., D/A conversion circuit) as the elements described with reference to FIG. 2** etc. are indicated by the same symbols. Description of these elements is appropriately omitted.

In the fourth configuration example, the slope of a variation in the data voltages V1 to Vk (along the arrangement direction of the scan lines) is corrected by correcting the data voltages V1 to Vk using correction divided voltages VCB1 to VCBk (correction divided signals).

The correction voltage generation circuit 230 generates correction voltages (first and second correction signals in a broad sense) that are supplied to the correction D/A conversion circuits 210-1 and 210-2. The correction voltage generation circuit 230 includes a resistor ladder, for example.

The correction D/A conversion circuits 210-1 and 210-2 receive correction data CDG1 and CDG2 (first and second correction data), and subject the correction data CDG1 and CDG2 to D/A conversion. The correction D/A conversion circuits 210-1 and 210-2 output correction output voltages VCG1 and VCG2 (first and second correction output signals in a broad sense) generated by D/A conversion.

The data line driver circuits 140-1 to **140-*k* respectively include the operational amplifiers OP1 to OPk, the input capacitors CI1 to CIk, and the correction capacitors CA1 to CAk. The correction divided voltages VCB1 to VCBk obtained by dividing the voltage between the correction output voltages VCG1 and VCG2 using resistor elements R1 to Rk−1 are respectively input to the correction capacitors CA1 to CAk. Specifically, the resistor element R1 is provided between the nodes NCA1 and NCA2, and the resistor element R2 is provided between the nodes NCA2 and NCA3. The resistor element Rk−1 is provided between the nodes NCAk−1 and NCAk. The correction divided voltage VCB1 (=VCG1) is output to the node NCA1, and the correction divided voltage VCB2 is output to the node NCA2. The correction divided voltage VCBk (=VCG2) is output to the node NCAk. The output voltages VQ1 to VQk from the D/A conversion circuits 110-1 to 110-*k*** are respectively input to the input capacitors CI1 to CIk in the same mariner as in the first configuration example. The data voltages V1 to Vk are respectively supplied to the data lines S1 to Sk from the operational amplifiers OP1 to OPk.

The control circuit 220 outputs the correction data CDG1 and CDG2 to the correction D/A conversion circuits 210-1 and 210-2. The control circuit 220 includes a slope correction register 222. The correction data CDG1 and CDG2 is set in the slope correction register 222 from a host controller (not shown) (e.g., the display controller 40 shown in FIG. 19 (described later)), for example. The control circuit 220 outputs the correction data CDG1 and CDG2 set in the slope correction register 222 to the correction D/A conversion circuits 210-1 and 210-2.

According to the fourth configuration example of this embodiment, the correction D/A conversion circuits 210-1 and 210-2 respectively output the correction output voltage VCG1 and VCG2 that correspond to the correction data CDG1 and CDG2, and the correction divided voltages VCB1 to VCBk are generated by dividing the voltage between the correction output voltage VCG1 and VCG2. This makes it possible to generate the correction divided voltages VCB1 to VCBk that slope corresponding to the order of the data lines S1 to Sk. Therefore, a variation in the data voltages V1 to Vk that slope corresponding to the order of the data lines S1 to Sk (i.e., a variation in the data voltages that sequentially change along the arrangement direction of the scan lines) can be corrected.

Figure 9:
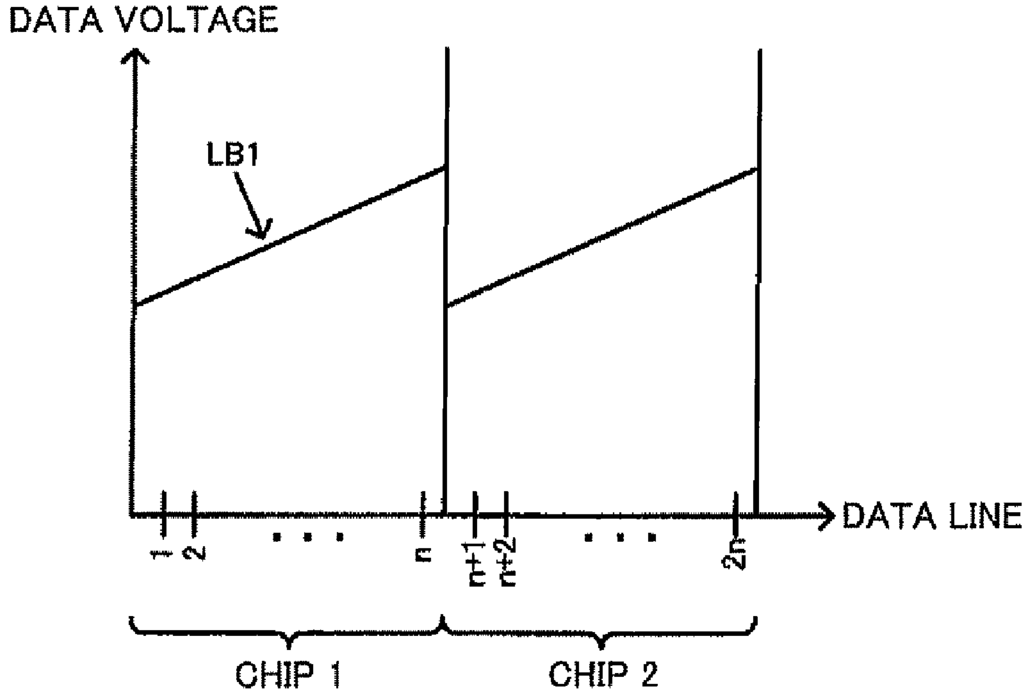
FIG. 9 is a view illustrative of correction of the slope of a variation in data voltage.

In FIG. 9, LB1 indicates that the data voltage corresponding to image data that corresponds to an identical grayscale increases from the first data line to the nth data line, for example. When a variation in the data voltages slopes corresponding to the order of the data lines, display non-uniformity in which the luminance changes along the direction of the scan line occurs in the display image. According to this embodiment, since a variation in the data voltages V1 to Vk that slope corresponding to the order of the data lines S1 to Sk can be corrected, it is possible to correct display non-uniformity in which the luminance changes along the direction of the scan line.

The above description has been given taking an example in which the voltage between the correction output voltages VCG1 and VCG2 is divided using the resistors. Note that the voltage between the correction output voltages VCG1 and VCG2 may be divided by utilizing a parasitic resistance (e.g., wiring resistance).

3. Data Line Driver Circuit 3.1. First Detailed Configuration Example

A first basic configuration example of the data line driver circuit is described below with reference to FIGS. 10 to 12. This basic configuration example is the basic configuration of a first detailed configuration example of the data line driver circuit described later.

Figure 10:
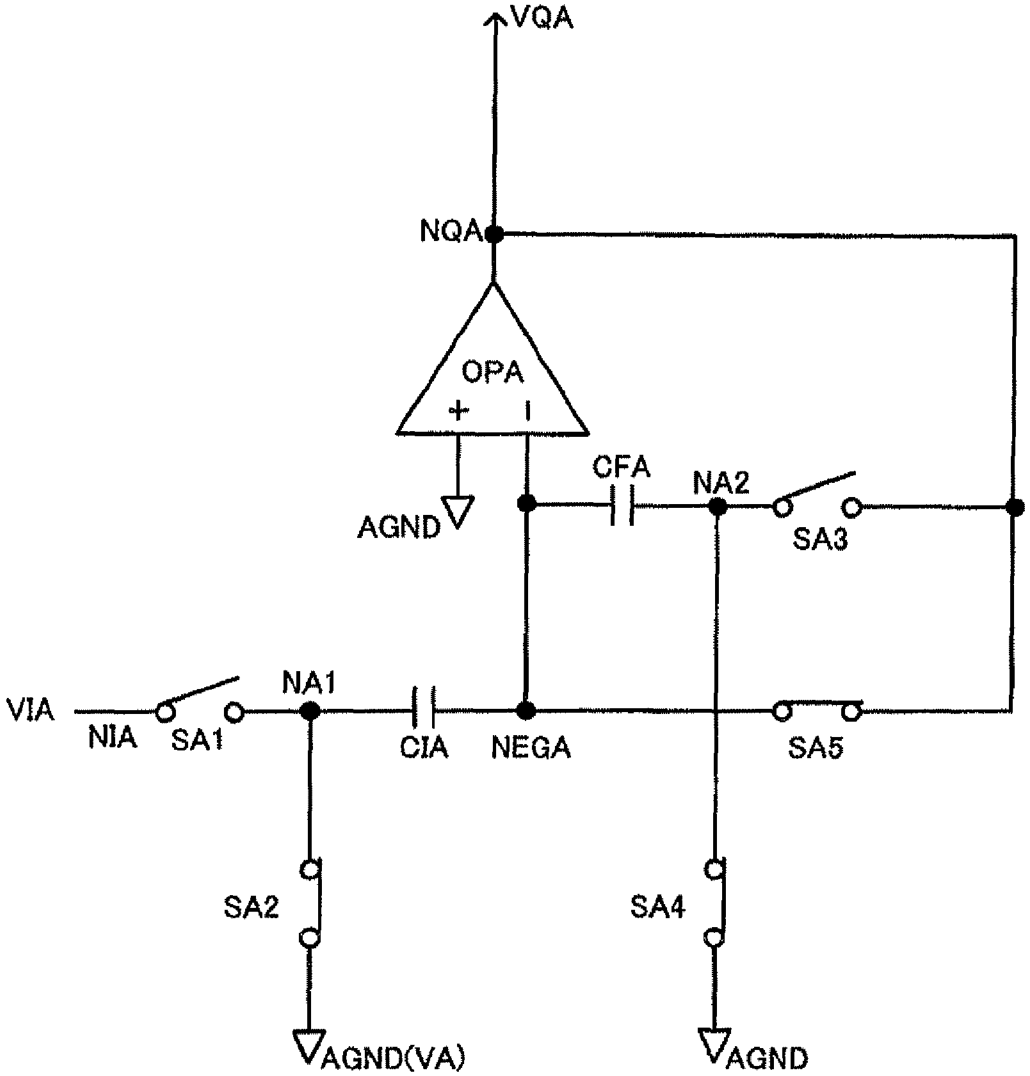
FIG. 10 shows a first basic configuration example of a data line driver circuit.

The data line driver circuit shown in FIG. 10 includes an operational amplifier OPA, an input capacitor CIA, a feedback capacitor CFA, and first to fifth switch elements SA1 to SA5. The data line driver circuit receives an input voltage VIA, and outputs an output voltage VQA to drive a data line.

The capacitor CIA is provided between a summing node NEGA (reference node, negative node, inverting input terminal node, or charge storage node) and a first node NA1. The capacitor CFA is provided between the summing node NEGA and a second node NA2. Each of the capacitors CIA and CFA may be formed by a plurality of unit capacitors, for example.

The switch element SA1 is provided between the node NA1 and the input node NIA. The switch element SA2 is provided between the node NA1 and a power supply voltage AGND (analog reference power supply in a broad sense). The switch element SA3 is provided between the node NA2 and an output node NQA. The switch element SA4 is provided between the node NA2 and the power supply AGND (AGND node). The switch element SA5 is provided between the summing node NEGA and the output node NQA.

The switch elements SA1 to SA5 may be formed by CMOS transistors, for example. Specifically, the switch elements SA1 to SA4 may be formed by transfer gates that include a P-type transistor and an N-type transistor. These transistors are turned ON/OFF based on switch control signals output from a switch control signal generation circuit (not shown). The power supply voltage AGND is a voltage between a low-potential-side power supply voltage VSS (first power supply voltage) and a high-potential-side power supply voltage VDD (second power supply voltage) (e.g., AGND=(VDD+VSS)/2), for example. The power supply voltage AGND is supplied from the power supply circuit 50 shown in FIG. 19 (described later), for example.

An inverting input terminal (first input terminal in a broad sense) of the operational amplifier OPA is connected to the summing node NEGA, and a non-inverting input terminal (second input terminal in a broad sense) of the operational amplifier OPA is set at the power supply voltage AGND. The operational amplifier OPA outputs the output voltage VQA to the output node NQA (output terminal node).

In the data line driver circuit according to the first basic configuration example, the switch elements SA2, SA4, and SA5 are turned ON in an initialization period (i.e., a period in which an initialization voltage is applied across the capacitors CI and CF), as shown in FIG. 10.

When the switch element SA2 is turned ON in the initialization period, the other end of the capacitor CIA of which one end is electrically connected to the summing node NEGA is set at the power supply voltage AGND (analog reference voltage VA). Likewise, when the switch element SA4 is turned ON in the initialization period, the other end of the capacitor CFA of which one end is electrically connected to the summing node NEGA is set at the power supply voltage AGND (VA). When the switch element SA5 (i.e., feedback switch element) is turned ON, the output from the operational amplifier OPA is fed back to the inverting input terminal, and the node NEGA is set at the power supply voltage AGND due to the virtual short-circuit function of the operational amplifier OPA.

Figure 11:
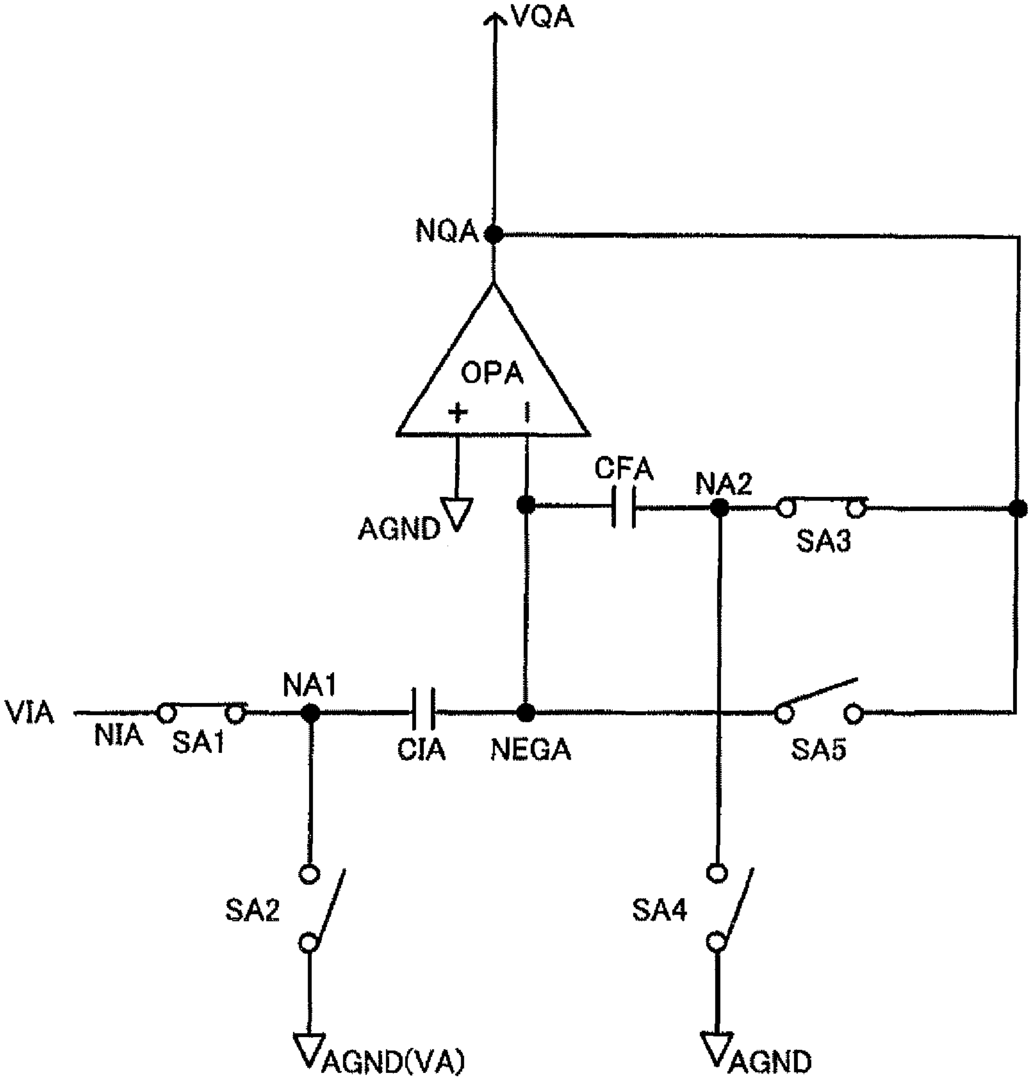
FIG. 11 shows a first basic configuration example of a data line driver circuit.

In the data line driver circuit according to the first basic configuration example, the switch elements SA1 and SA3 are turned ON in an output period (i.e., a period in which the output voltage is output to drive the data line), as shown in FIG. 11.

When the switch element SA1 is turned ON in the output period, the other end of the capacitor CIA of which one end is connected to the summing node NEGA is set at the input voltage VIA. When the switch element SA3 is turned ON, the other end of the capacitor CFA of which one end is connected to the summing node NEGA is set at the output voltage VQA (output from the operational amplifier OPA).

Figure 12A:
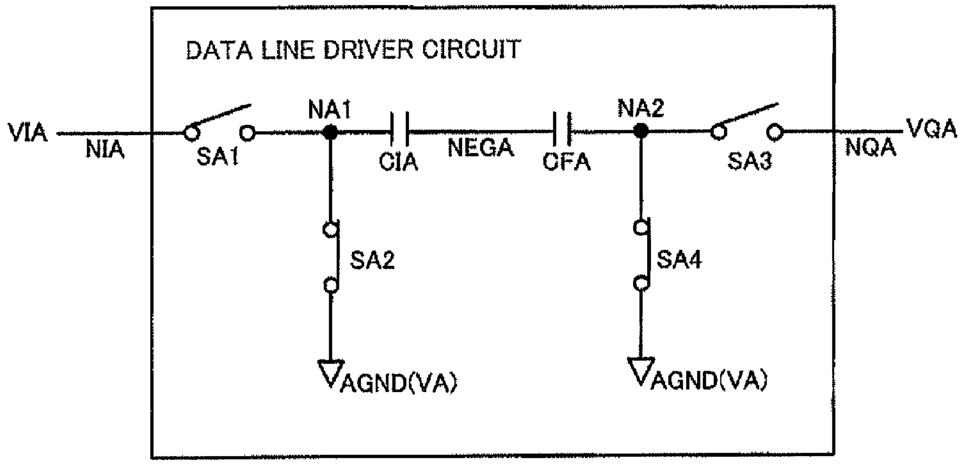
FIGS. 12A to 12C show a fundamental configuration example of a data line driver circuit.

FIG. 12A shows a fundamental configuration of the data line driver circuit according to the first basic configuration example. As shown in FIG. 12A, the data line driver circuit according to the first basic configuration example includes the capacitors CIA and CFA. One end of the capacitor CIA is connected to the summing node NEGA, and the other end of the capacitor CIA is set at the analog reference voltage VA in the initialization period, and set at the input voltage VIA in the output period. One end of the capacitor CFA is connected to the summing node NEGA, and the other end of the capacitor CFA is set at the analog reference voltage VA in the initialization period, and set at the output voltage VQA in the output period.

Note that the summing node NEGA (i.e., a connection node between the capacitors CIA and CFA) is set at a given voltage (e.g., VA or VA−ΔVof) in the initialization period, and is set at the same potential as in the initialization period in a high impedance state (floating state) in the output period. In FIGS. 1 and 11, the function of the node NEGA is implemented by utilizing the operational amplifier OPA. Note that the function of the node NEGA may be implemented by a circuit other than the operational amplifier OPA.

The relationship between the input voltage VIA and the output voltage VQA in the data line driver circuit according to the first basic configuration example is described below with reference to FIGS. 12B and 12C.

Figure 12B:
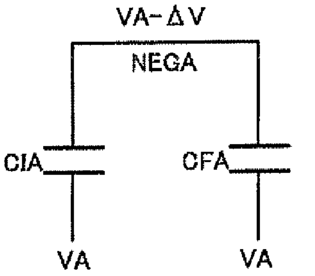

In the initialization period, one end of the capacitors CIA and CFA is set at the voltage VA, and the other end of the capacitors CIA and CFA is set at VA−ΔV, as shown in FIG. 12B. Note that ΔV refers to the offset voltage of the operational amplifier OP.

Figure 12C:
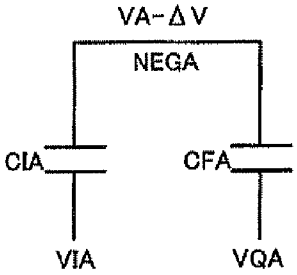

In the output period, one end of the capacitor CIA is set at the input voltage VIA, the other end of the capacitor CIA is set at VA−ΔV, one end of the capacitor CFA is set at the output voltage VQA, and the other end of the capacitor CFA is set at VA−ΔV, as shown in FIG. 12C. Therefore, the following expression (1) is satisfied according to the principle of charge conservation.

$$CIA\times\{VA-(VA-\Delta V)\}+CFA\times\{VA-(VA-\Delta V)\}=CIA\times\{VIA-(VA-\Delta V)\}+CFA\times\{VQA-(VA-\Delta V)\} \quad (1)$$

Therefore, the following expression (2) is satisfied.

$$VQA=VA-(CIA/CFA)\times(VIA-VA) \quad (2)$$

As is clear from the expression (2), since the offset voltage ΔV is not involved in the output voltage VQA, an offset-free state can be implemented.

Figure 13:
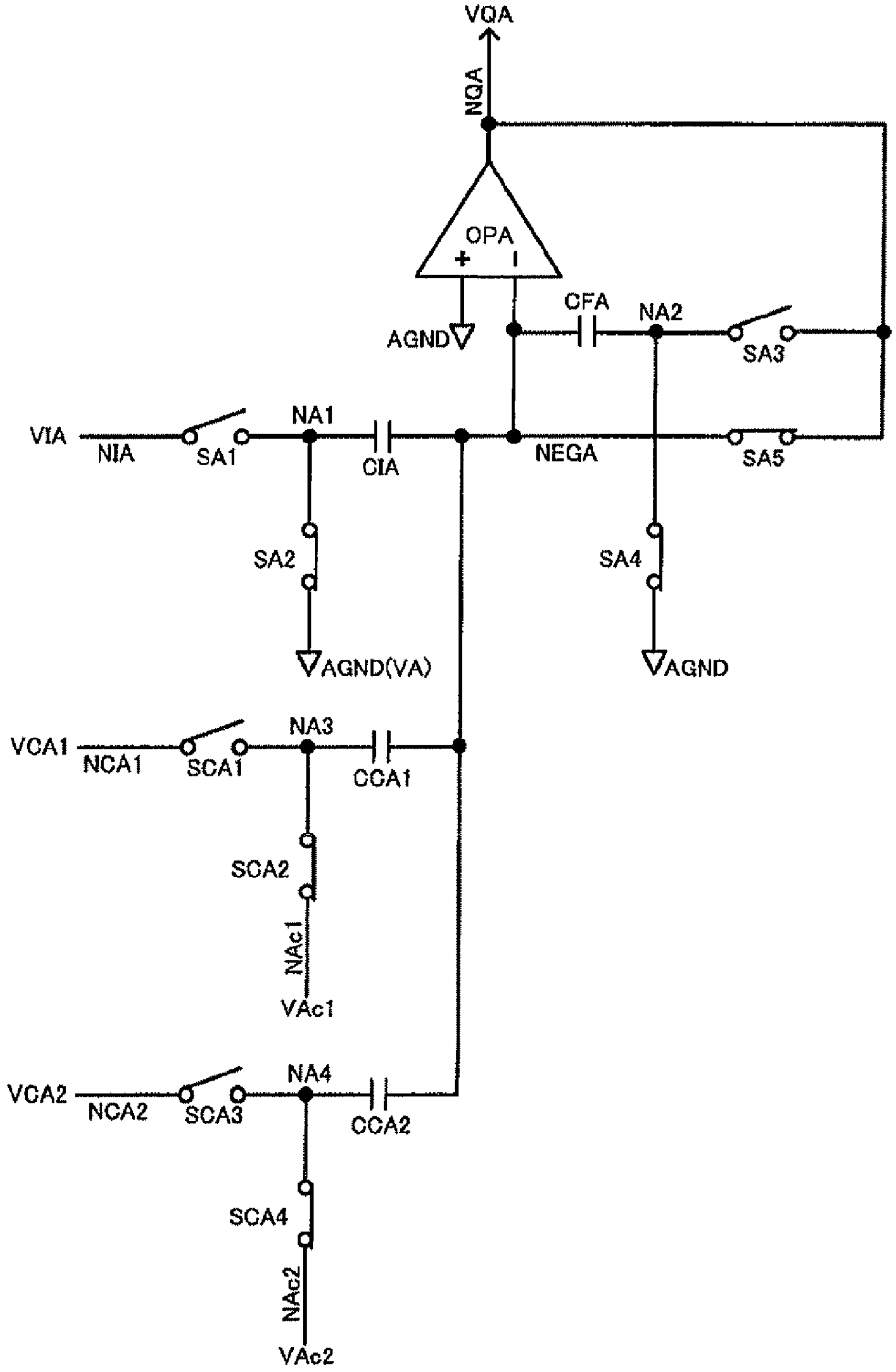
FIG. 13 shows a first detailed configuration example of a data line driver circuit.

FIG. 13 shows the first detailed configuration example of the data line driver circuit. The data line driver circuit shown in FIG. 13 includes the elements (CIA, CFA, SA1 to SA5, and OPA) of the data line driver circuit described with reference to FIG. 10, and further includes first and second correction capacitors CCA1 and CCA2 and first to fourth correction switch elements SCA1 to SCA4. The data line driver circuit shown in FIG. 13 receives the input voltage VIA, the first correction input voltage VCA1, and the second correction input voltage VCA2, and outputs the output voltage VQA. Note that the same elements (e.g., CIA, CFA, SA1 to SA5, and OPA) as the elements described with reference to FIGS. 10 and 11, etc., are indicated by the same symbols. Description of these elements is appropriately omitted.

The capacitor CCA1 is provided between the summing node NEGA and a third node NA3. The capacitor CCA2 is provided between the summing node NEGA and a fourth node NA4. Each of the capacitors CCA1 and CCA2 may be formed by a plurality of unit capacitors, for example.

The switch element SCM is provided between the node NA3 and the first correction input node NCA1. The switch element SCA2 is provided between the node NA3 and a first correction reference voltage node NAc1. The switch element SCA3 is provided between the node NA4 and the second correction input node NCA2. The switch element SCA4 is provided between the node NA4 and a second correction reference voltage node NAc2. The switch elements SCM to SCA4 may be formed by CMOS transistors, for example. Specifically, the switch elements SCA1 to SCA4 may be formed by transfer gates that include a P-type transistor and an N-type transistor. These transistors are turned ON/OFF based on switch control signals output from a switch control signal generation circuit (not shown).

The correction input voltages VCA1 and VCA2 are respectively input to the correction input nodes NCA1 and NCA2, and first correction reference voltages VAc1 and VAc2 are respectively input to the correction reference voltage nodes NAc1 and NAc2. The voltages VCA1, VCA2, VAc1, and VAc2 are supplied from the D/A conversion circuit 120 (see FIG. 2 etc.), for example. The correction reference voltages VAc1 and VAc2 are correction voltages that correspond to given grayscale correction data (e.g., correction voltages that correspond to the 32-grayscale correction data in FIG. 3B), for example.

In the data line driver circuit according to the first detailed configuration example, the switch elements SCA2, SCA4, SA2, SA4, and SA5 are turned ON in the initialization period (i.e., a period in which the initialization voltage is applied across the capacitors CIA, CFA, CCA1, and CCA2), as shown in FIG. 13. The node NEG is set at the voltage VA (AGND) in the same manner as in FIG. 10. When the switch element SCA2 is turned ON, one end of the capacitor CCA1 on the side of the node NA3 is set at the voltage VAc1, and the other end of the capacitor CCA1 on the side of the node NEGA is set at the voltage VA. When the switch element SCA4 is turned ON, one end of the capacitor CCA2 on the side of the node NA4 is set at the voltage VAc2, and the other end of the capacitor CCA2 on the side of the node NEGA is set at the voltage VA. Each end of the capacitors CIA and CFA is set at the voltage VA in the same manner as in FIG. 10.

Figure 14:
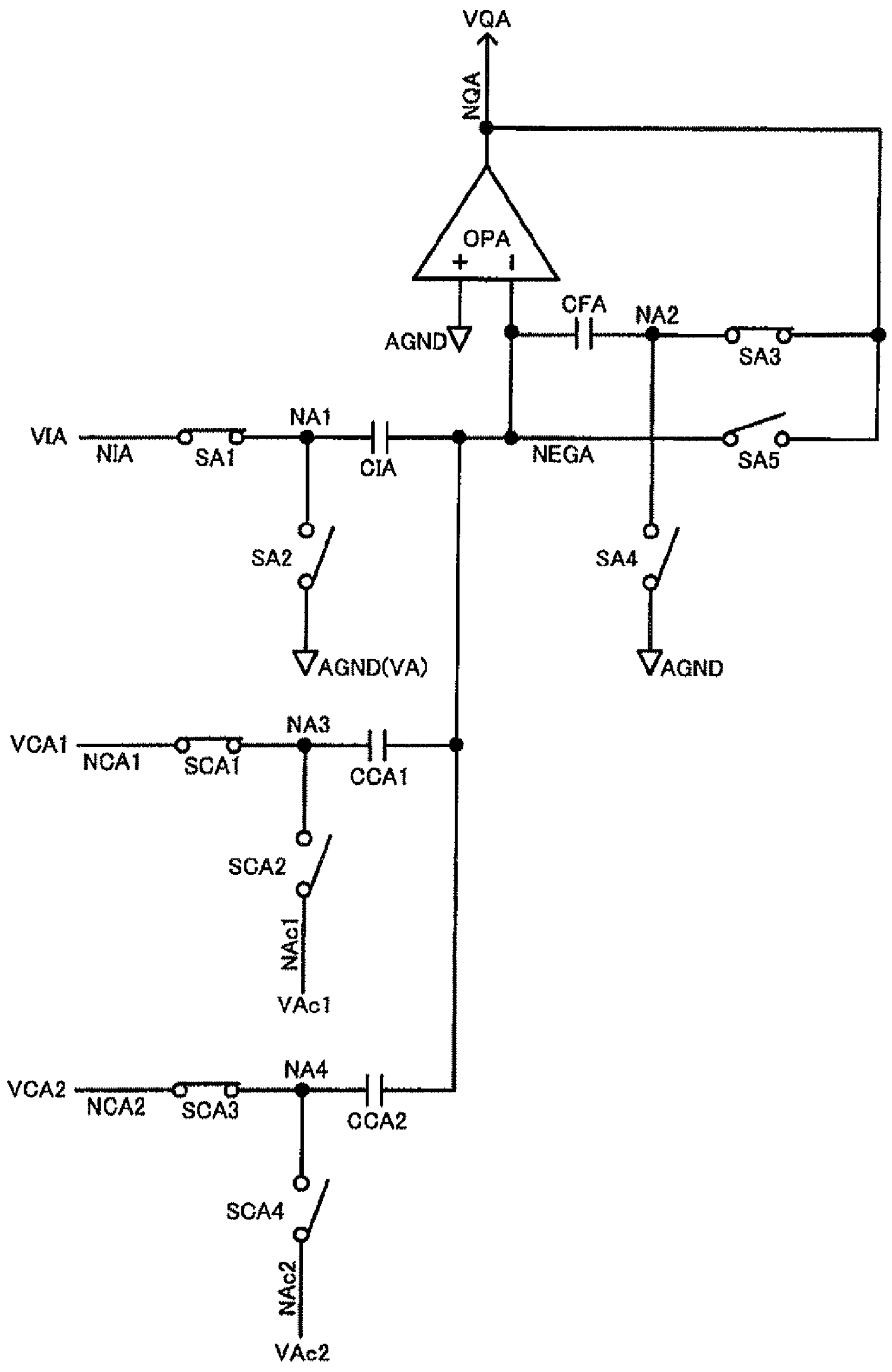
FIG. 14 shows a first detailed configuration example of a data line driver circuit.

In the data line driver circuit according to the first basic configuration example, the switch elements SCA1, SCA3, SA1, and SA3 are turned ON in the output period (i.e., a period in which the output voltage is output to drive the data line), as shown in FIG. 14. When the switch element SCA1 is turned ON, one end of the capacitor CCA1 on the side of the node NA3 is set at the correction input voltage VCA1. When the switch element SCA3 is turned ON, one end of the capacitor CCA2 on the side of the node NA4 is set at the correction input voltage VCA2. One end of the capacitor CIA on the side of the node NA1 is set at the voltage VIA, and one end of the capacitor CFA on the side of the node NA2 is set at the voltage VQA in the same manner as in FIG. 11.

The following expression (3) is satisfied according to the principle of charge conservation. In the expression (3), ΔV refers to the offset voltage of the operational amplifier OPA.

$$CIA\times\{VA-(VA-\Delta V)\}+CCA1\times\{VAc1-(VA-\Delta V)\}+CCA2\times\{VAc2-(VA-\Delta V)\}+CFA\times\{VA-(VA-\Delta V)\} + CIA\times\{VIA-(VA-\Delta V)\}+CCA1\times\{VCA1-(VA-\Delta V)\}+CCA2\times\{VCA2-(VA-\Delta V)\}+CFA\times\{VQA-(VA-\Delta V)\} \quad (3)$$

Therefore, the following expression (4) is satisfied.

$$VQA=VA-(CIA/CFA)\times(VIA-VA)-(CCA1/CFA)\times(VCA1-VAc1)-(CCA2/CFA)\times(VCA2-VAc2) \quad (4)$$

As shown in the expression (4), the output voltage VQA includes a term (correction term) including VCA 1, VCA2, VAc1, and VAc2. Therefore, when the voltages VCA1, VCA2, VAc1, and VAc2 (correction output voltages) are input from the correction D/A conversion circuit, the output voltage VQA (data voltage) output from the data line driver circuit can be corrected based on the voltages VCA1, VCA2, VAc1, and VAc2. As is clear from the expression (4), since the offset voltage ΔV is not involved in the output voltage VQA, an offset-free state can be implemented.

Note that the data line driver circuit according to this embodiment is not limited to the configuration shown in FIG. 13. Various modifications may be made, such as omitting some of the elements or adding other elements. For example, the operational amplifier OPA may be omitted, or the correction capacitor CCA1 and the correction switch elements SCA1 and SCA2 may be omitted, or the correction capacitor CCA2 and the correction switch elements SCA3 and SCA4 may be omitted.

3.2 Second Detailed Configuration Example

A second basic configuration example of the data line driver circuit is described below with reference to FIGS. 15 and 16. This basic configuration example is the basic configuration of a second detailed configuration example of the data line driver circuit described later.

Figure 15:
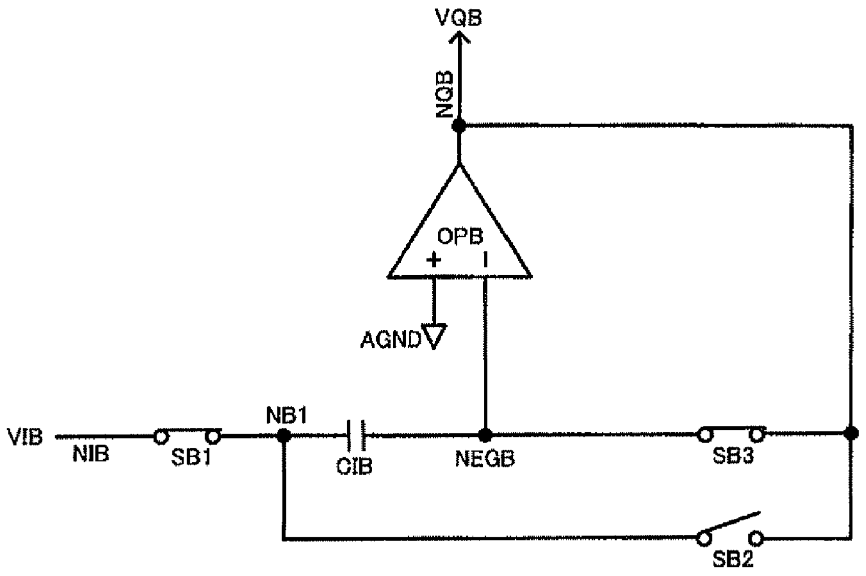
FIG. 15 shows a second basic configuration example of a data line driver circuit.

The data line driver circuit shown in FIG. 15 includes an operational amplifier OPB, an input capacitor CIB, and first to fifth switch elements SB1 to SB3. The data line driver circuit receives an input voltage VIB, and outputs an output voltage VQB to drive a data line.

The capacitor CIB is provided between a summing node NEGB (reference node, negative node, inverting input terminal node, or charge storage node) and a first node NB1. The capacitor CIB may be formed by a plurality of unit capacitors, for example.

The switch element SB1 is provided between the node NB1 and an input node NIB. The switch element SB2 is provided between the node NB1 and an output node NQB. The switch element SB3 is provided between the summing node NEGB and the output node NQB. The switch elements SB1 to SB3 may be formed by CMOS transistors, for example. Specifically, the switch elements SB1 to SB3 may be formed by transfer gates that include a P-type transistor and an N-type transistor. These transistors are turned ON/OFF based on switch control signals output from a switch control signal generation circuit (not shown).

An inverting input terminal (first input terminal in a broad sense) of the operational amplifier OPB is connected to the summing node NEGB, and a non-inverting input terminal (second input terminal in a broad sense) of the operational amplifier OPB is set at the power supply voltage AGND. The operational amplifier OPB outputs the output voltage VQB to the output node NQB (output terminal node). The power supply voltage AGND is a voltage between the low-potential-side power supply voltage VSS (first power supply voltage) and the high-potential-side power supply voltage VDD (second power supply voltage) (e.g., AGND=(VDD+VSS)/2), for example. The power supply voltage AGND is supplied from the power supply circuit 50 shown in FIG. 19 (described later), for example.

In the data line driver circuit according to the second basic configuration example, the switch elements SB1 and SB3 are turned ON in an initialization period (i.e., a period in which an initialization voltage is applied across the capacitor CIB), as shown in FIG. 15. When the switch element SB1 is turned ON, the other end of the capacitor CIB of which one end is connected to the summing node NEGB is set at the input voltage VIB. When the switch element SB3 (i.e., feedback switch element) is turned ON, the output from the operational amplifier OPB is fed back to the inverting input terminal, and the node NEGB is set at the power supply voltage AGND (analog reference voltage VA) due to the virtual short-circuit function of the operational amplifier OPB.

Figure 16:
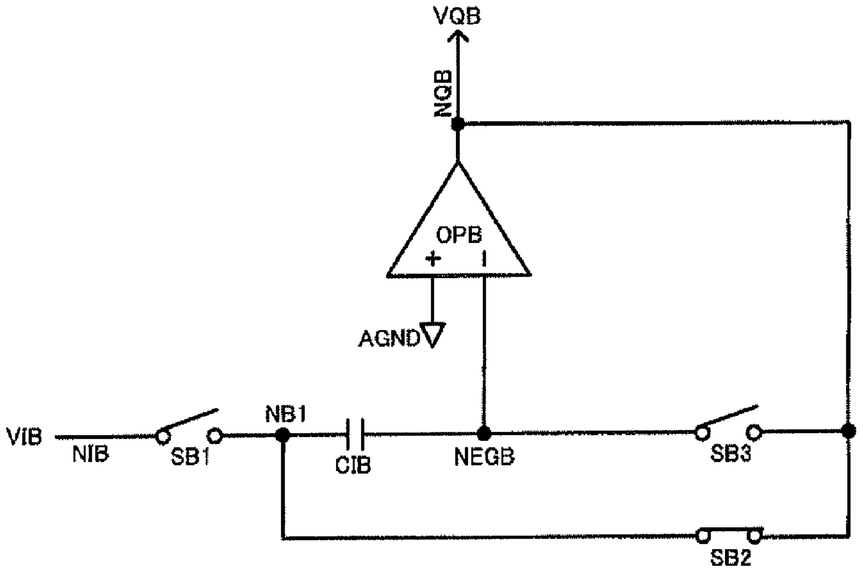
FIG. 16 shows a second basic configuration example of a data line driver circuit.

In the data line driver circuit according to the second basic configuration example, the switch element SB2 is turned ON in an output period (i.e., a period in which the output voltage is output to drive the data line), as shown in FIG. 16. When the switch element SB2 is turned ON in the output period, the other end of the capacitor CIB of which one end is connected to the summing node NEGB is set at the output voltage VQB.

The following expression (5) is satisfied according to the principle of charge conservation. In the expression (5), ΔV refers to the offset voltage of the operational amplifier OPB.

$$CIB\times\{VIB-(VA-\Delta V)\}=CIB\times\{VQB-(VA-\Delta V)\} \quad (5)$$

Therefore, the following expression (6) is satisfied.

$$VQB=VIB \quad (6)$$

As is clear from the expression (6), since the offset voltage ΔV is not involved in the output voltage VQB, an offset-free state can be implemented.

Figure 17:
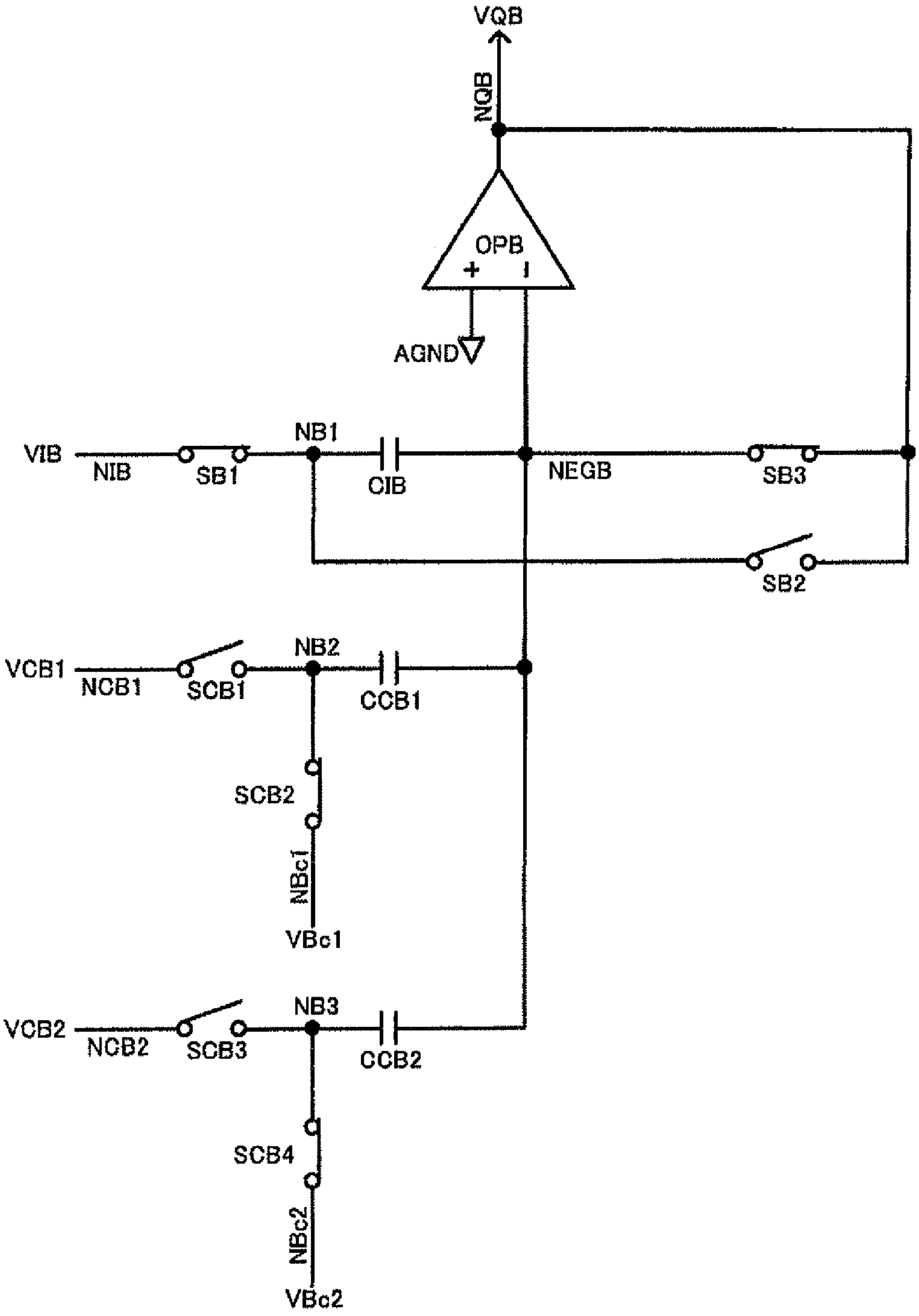
FIG. 17 shows a second detailed configuration example of a data line driver circuit.

FIG. 17 shows the first detailed configuration example of the data line driver circuit. The data line driver circuit shown in FIG. 17 includes the elements (CIB, SB1 to SB3, and OPB) of the data line driver circuit described with reference to FIG. 15, and further includes first and second correction capacitors CCB1 and CCB2 and first to fourth correction switch elements SCB1 to SCB4. The data line driver circuit shown in FIG. 17 receives the input voltage VIB, the first correction input voltage VCB1, and the second correction input voltage VCB2, and outputs the output voltage VQB. Note that the same elements (e.g., CIB, SB1 to SB3, and OPB) as the elements described with reference to FIGS. 15 and 16 etc. are indicated by the same symbols. Description of these elements is appropriately omitted.

The capacitor CCB1 is provided between the summing node NEGB and a second node NB2. The capacitor CCB2 is provided between the summing node NEGB and a third node NB3. Each of the capacitors CCB1 and CCB2 may be formed by a plurality of unit capacitors, for example.

The switch element SCB1 is provided between the node NB2 and a first correction input node NCB1. The switch element SCB2 is provided between the node NB2 and a first correction reference voltage node NBc1. The switch element SCB3 is provided between the node NB3 and a second correction input node NCB2. The switch element SCB4 is provided between the node NB3 and a second correction reference voltage node NBc2. The switch elements SCB1 to SCB4 may be formed by transfer gates using CMOS transistors, for example. These CMOS transistors are turned ON/OFF based on switch control signals output from a switch control signal generation circuit (not shown).

The correction input voltages VCB1 and VCB2 are respectively input to the correction input nodes NCB1 and NCB2, and the first correction reference voltages VBc1 and VBc2 are respectively input to the correction reference voltage nodes NBc1 and NBc2. The voltages VCB1, VCB2, VBc1, and VBc2 are supplied from the D/A conversion circuit 120 (see FIG. 2 etc.), for example. The correction reference voltages VBc1 and VBc2 are correction voltages that correspond to given grayscale correction data (e.g., correction voltages that correspond to the 32-grayscale correction data in FIG. 3B), for example.

In the data line driver circuit according to the second detailed configuration example, the switch elements SCB2, SCB4, SB1, and SB3 are turned ON in a sample period (i.e., a period in which the initialization voltage is applied across the capacitors CIB, CCB1, and CCB2), as shown in FIG. 17. The node NEGB is set at the voltage VA (AGND) in the same manner as in FIG. 15. When the switch element SCB2 is turned ON, one end of the capacitor CCB1 on the side of the node NB2 is set at the voltage VBc1, and the other end of the capacitor CCB1 on the side of the node NEGB is set at the voltage VA. When the switch element SCB4 is turned ON, one end of the capacitor CCB2 on the side of the node NB3 is set at the voltage VBc2, and the other end of the capacitor CCB2 on the side of the node NEGB is set at the voltage VA. Note that one end of the capacitor CIB on the side of the node NB1 is set at the voltage VIB, and the other end of the capacitor CIB on the side of the summing node NEGB is set at the voltage VA in the same manner as in FIG. 15.

Figure 18:
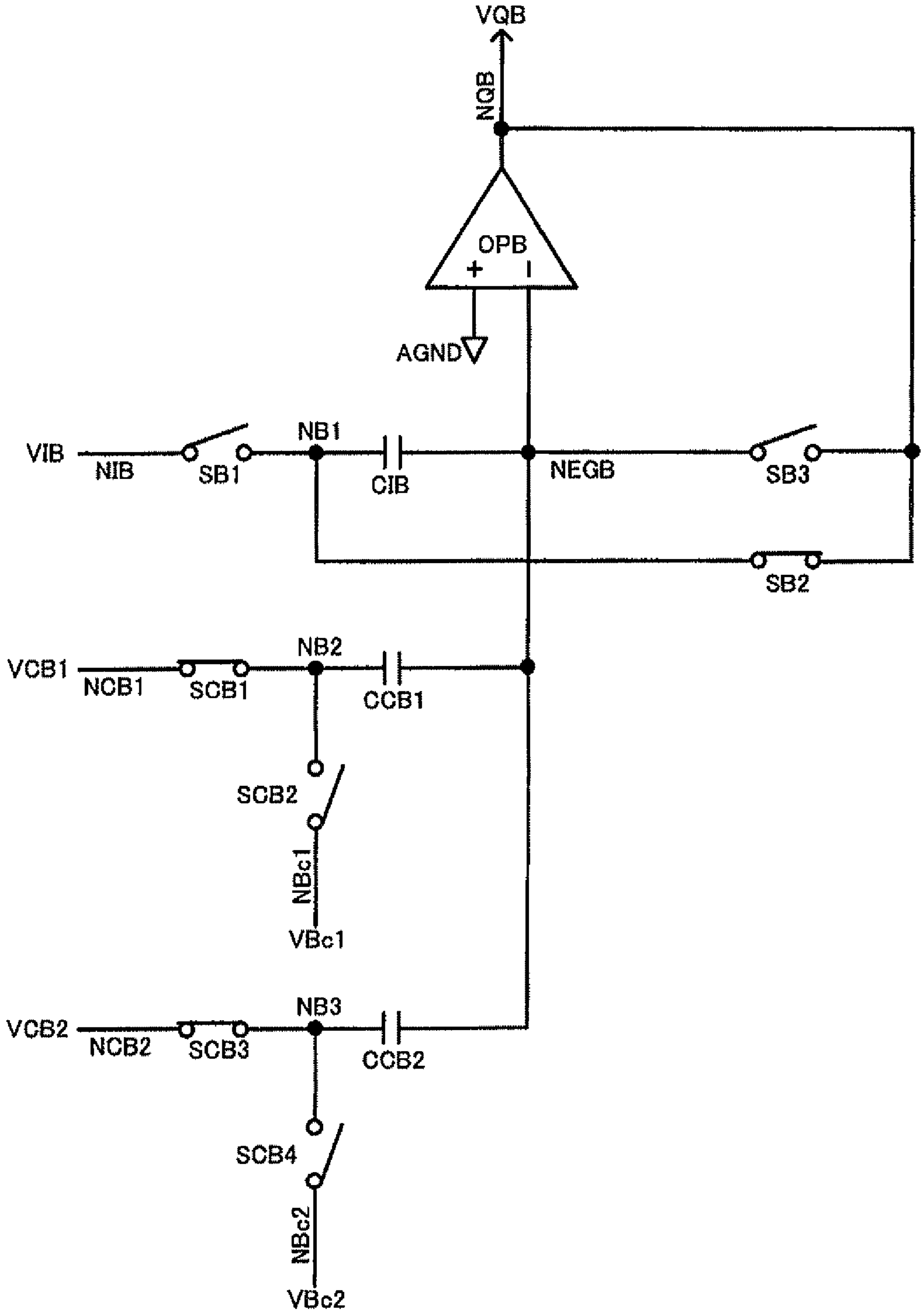
FIG. 18 shows a second detailed configuration example of a data line driver circuit.

In the data line driver circuit according to the second basic configuration example, the switch elements SCB1, SCB3, and SB2 are turned ON in the output period (i.e., a period in which the output voltage is output to drive the data line), as shown in FIG. 18. When the switch element SCB1 is turned ON, one end of the capacitor CCB1 on the side of the node NB2 is set at the correction input voltage VCB1. When the switch element SCB3 is turned ON, one end of the capacitor CCB2 on the side of the node NB3 is set at the correction input voltage VCB2. One end of the capacitor CIB on the side of the node NB1 is set at the voltage VQB in the same manner as in FIG. 16.

The following expression (7) is satisfied according to the principle of charge conservation. In the expression (7), ΔV refers to the offset voltage of the operational amplifier OPB.

$$CIB\times\{VIB-(VA-\Delta V)\}+CCB1\times\{VBc1-(VA-\Delta V)\}+CCB2\times\{VBc2-(VA-\Delta V)\}=CIB\times\{VQB-(VA-\Delta V)\}+CCB1\times\{VCB1-(VA-\Delta V)\}+CCB2\times\{VCB2-(VA-\Delta V)\} \quad (7)$$

Therefore, the following expression (8) is satisfied.

$$VQB=VIB-(CCB1/CIB)\times(VCB1-VBc1)-(CCB2/CIB)\times(VCB2-VBc2) \quad (8)$$

As shown in the expression (8), the output voltage VQB includes a term (correction term) including VCB1, VCB2, VBc1, and VBc2. Therefore, when the voltages VCB1, VCB2, VBc1, and VBc2 (correction output voltages) are input from the correction D/A conversion circuit, the output voltage VQB (data voltage) output from the data line driver circuit can be corrected based on the voltages VCB1, VCB2, VBc1, and VBc2. As is clear from the expression (7), since the offset voltage ΔV is not involved in the output voltage VQB, an offset-free state can be implemented.

Note that the data line driver circuit according to this embodiment is not limited to the configuration shown in FIG. 17. Various modifications may be made, such as omitting some of the elements or adding other elements. For example, the operational amplifier OPB may be omitted, or the correction capacitor CCB1 and the correction switch elements SCB1 and SCB2 may be omitted, or the correction capacitor CCB2 and the correction switch elements SCB3 and SCB4 may be omitted.

4. Electro-Optical Device 4.1. Configuration Example

Figure 19:
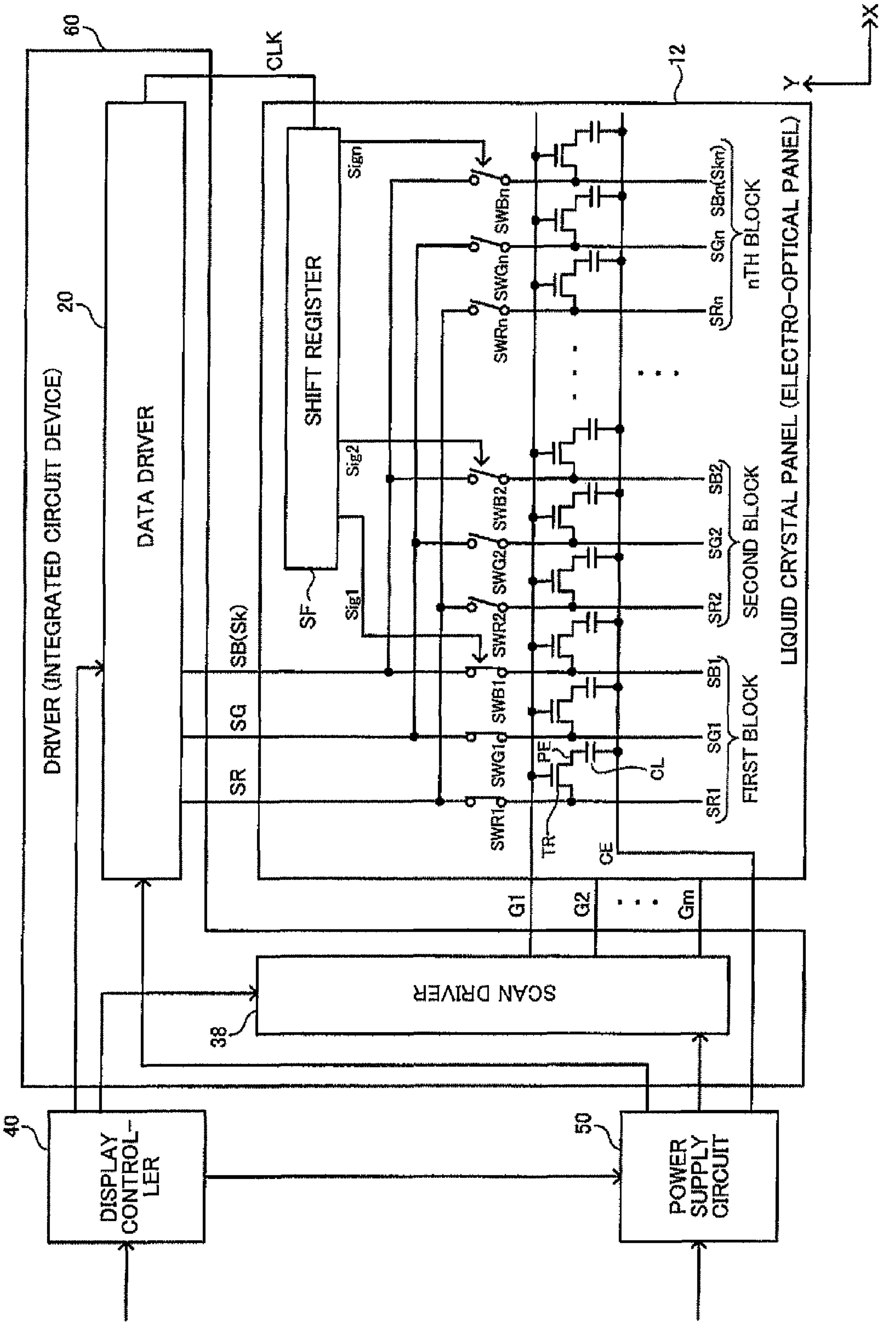
FIG. 19 shows a configuration example of an electro-optical device.

FIG. 19 shows a configuration example of an electro-optical device to which the integrated circuit device according to the above embodiment may be applied. FIG. 19 shows a configuration example of a liquid crystal display device that drives a liquid crystal panel as a configuration example of the electro-optical device. Note that the invention may also be applied to an electro-optical device that drives an electro-optical panel other than the liquid crystal panel. For example, the invention may also be applied to an electro-optical device that drives an electroluminescence (EL) panel that utilizes a light-emitting element such as an organic EL element or an inorganic EL element.

A liquid crystal display device (electro-optical device) according to the configuration example shown in FIG. 19 includes a liquid crystal panel 12 (electro-optical panel), a driver 60 (integrated circuit device), a display controller 40, and a power supply circuit 50. Note that the liquid crystal display device need not necessarily include all of these circuit blocks. The liquid crystal display device may have a configuration in which some of the circuit blocks are omitted.

The liquid crystal panel 12 (liquid crystal display (LCD)) may be an active matrix panel or a simple matrix panel. When the liquid crystal panel 12 is an active matrix panel, the liquid crystal panel 12 is formed on an active matrix substrate (e.g., glass substrate), for example. A plurality of scan lines G1 to Gm (m is a natural number equal to or larger than two) that extend in a direction X in FIG. 19, and a plurality of data lines SR1, SW, SB1, . . . , SRn, SGn, and SBn (n is a natural number equal to or larger than two) that extend in a direction Y, are disposed on the active matrix substrate. Switch elements SWR1, SWG1, SWB1, . . . , SWRn, SWGn, and SWBn that correspond to the data lines, a shift register SF, and data voltage supply lines SR, SG, and SB (source voltage supply lines) are also disposed on the active matrix substrate.

A thin film transistor (TFT; switching element in a broad sense) and a liquid crystal capacitor (liquid crystal element; electro-optical element in a broad sense) are provided at a position corresponding to each of the intersections of the scan lines and the data lines. For example, a thin film transistor TR and a liquid crystal capacitor CL are provided at a position corresponding to the intersection of the scan line G1 and the data line SR1. A gate electrode of the thin film transistor TR is connected to the scan line G1, a source electrode of the thin film transistor TR is connected to the data line SR1, and a drain electrode of the thin film transistor TR is connected to a pixel electrode PE. The liquid crystal capacitor CL is formed between the pixel electrode PE and a common electrode CE. The common electrode CE is formed on a common substrate that is opposite to the active matrix substrate, and a liquid crystal (electro-optical material in a broad sense) is sealed between the active matrix substrate and the common substrate.

The data lines SR1, SG1, SB1, . . . , SRn, SGn, and SBn are divided into a first block (SR1, SG1, and SB1) to nth block (SRn, SGn, and SBn). The liquid crystal panel 12 is driven by a scan drive method that sequentially drives the data lines from the first block to the nth block.

Specifically, the switch elements SWR1, SWG1, SWB1, . . . , SWRn, SWGn, and SWBn supply grayscale voltages supplied to the data voltage supply lines SR, SG, and SB by time division to the data lines in the first block to the nth block.

The shift register SF outputs control signals that cause the switch elements SWR1, SWG1, SWB1, SWRn, SWGn, and SWBn to be turned ON/OFF. The shift register SF receives a scan drive clock signal CLK from a data driver 20, and sequentially activates control signals Sig1 to Sign (i.e., sets the control signals Sig1 to Sign at the first logic level).

The switch elements SWR1, SWG1, and SWB1 are turned ON when the control signal Sig1 is activated, so that the data lines SR1, SG1, and SB1 in the first block are driven. The switch elements SWR2, SWG2, and SWB2 are turned ON when the control signal Sig2 is activated, so that the data lines SR2, SG2, and SB2 in the second block are driven. The switch elements SWRn, SWGn, and SWBn are turned ON when the control signal Sign is activated, so that the data lines SRn, SGn, and SBn in the nth block are driven. The data lines in the first to nth blocks are thus sequentially driven (scan drive).

The switch elements SWR1, SWG1, SWB1, . . . , SWRn, SWGn, SWBn and the shift register SF may be formed using a thin film transistor (TFT), for example.

The driver 60 includes the data driver 20 (source driver) and a scan driver 38 (gate driver). The data driver 20 drives the data lines SR1, SG1, SB1, . . . , SRn, SGn, and SBn based on grayscale data (image data). The scan driver 38 scans (sequentially drives) scan lines G1 to Gm of the liquid crystal panel 12. When the integrated circuit device according to this embodiment is applied as the driver 60, the data line driver circuits (e.g., the data line driver circuits 140-1 to **140-*k* shown in FIG. 2) drive the data lines SR1, SG1, SB1**, . . . , SRn, SGn, and SBn through the data voltage supply lines SR, SG, and SB.

The display controller 40 controls the data driver 20, the scan driver 38, and the power supply circuit 50 based on information set by a host controller (not shown) such as a central processing unit (CPU). For example, the display controller 40 sets an operation mode of the data driver 20 and the scan driver 38, and supplies a vertical synchronization signal and a horizontal synchronization signal generated therein to the data driver 20 and the scan driver 38. The display controller 40 controls the power supply circuit 50 with regard to the voltage level of the common electrode voltage VCOM applied to the common electrode CE, for example.

The power supply circuit 50 generates various voltage levels necessary for driving the display panel 12 and the voltage level of the common electrode voltage VCOM applied to the common electrode CE based on a power supply voltage supplied from the outside. For example, the data driver 20 includes a grayscale voltage generation circuit, and the power supply circuit 50 generates the voltage level of a power supply voltage of the grayscale voltage generation circuit.

The data driver 20 may drive the liquid crystal panel 12 by polarity inversion drive. The grayscale voltage generation circuit may include a positive grayscale voltage generation circuit and a negative grayscale voltage generation circuit. Alternatively, a positive grayscale voltage and a negative grayscale voltage may be generated by alternately switching a high-voltage-side power supply voltage and a low-voltage-side power supply voltage of the grayscale voltage generation circuit.

In FIG. 19, the data driver 20 sequentially drives three RGB data lines through the data voltage supply lines SR, SG, and SB. Note that the data driver 20 may sequentially drive k data lines through the data voltage supply lines S1 to Sk (k is a natural number equal to or larger than two).

In FIG. 19, the display controller 40 and the power supply circuit 50 are provided inside the liquid crystal display device. Note that the display controller 40 and the power supply circuit 50 may be provided outside the liquid crystal display device. Some or all of the data driver 20, the scan driver 38, the display controller 40, and the power supply circuit 50 may be formed on the display panel 12, or may be formed as a semiconductor device (integrated circuit (IC)).

4.2. Data Driver

Figure 20:
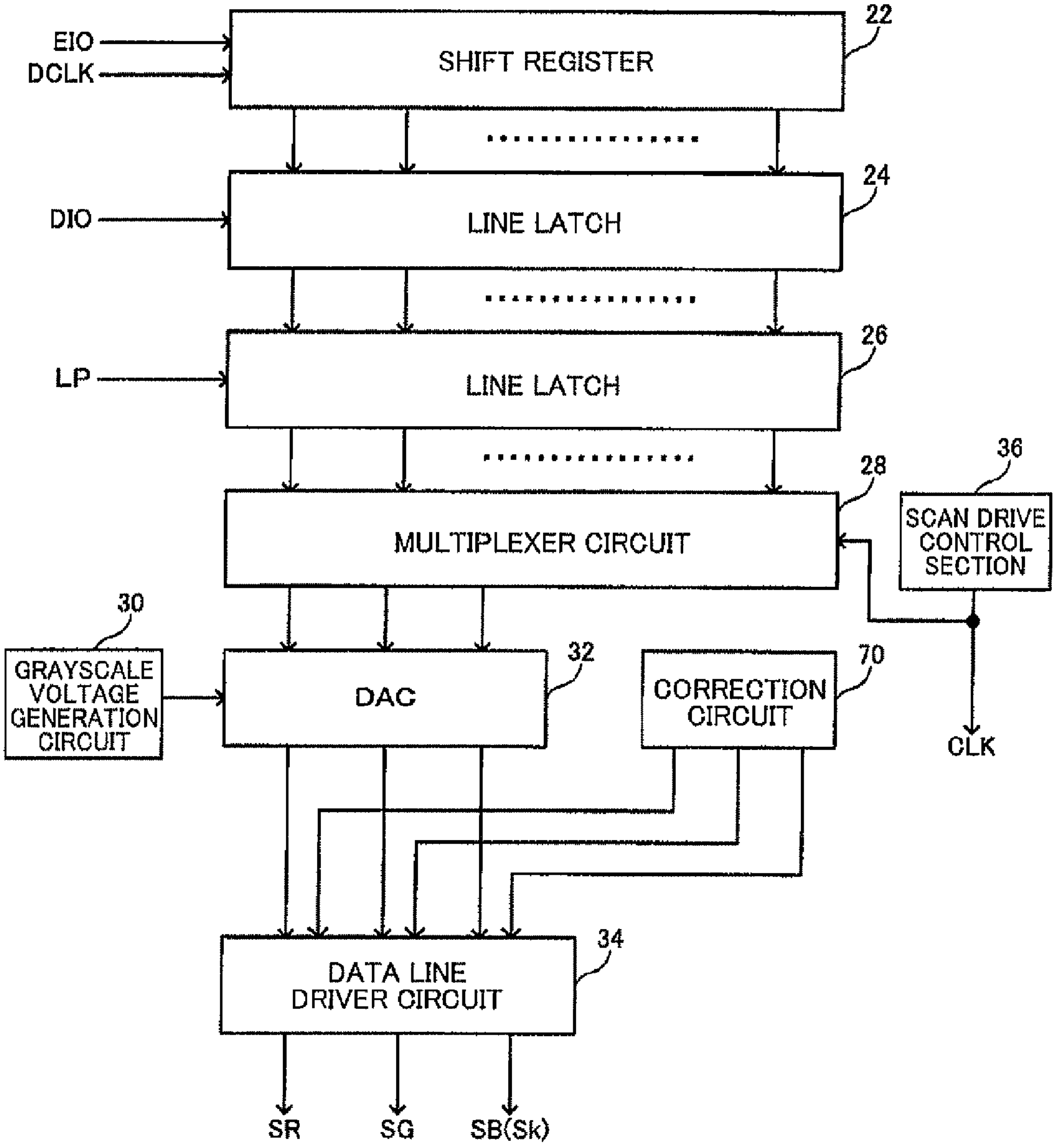
FIG. 20 shows a configuration example of a data driver.

FIG. 20 shows a configuration example of the data driver 20. The data driver 20 includes a shift register 22, line latches 24 and 26, a multiplexer circuit 28, a grayscale voltage generation circuit 30 (reference voltage generation circuit), a digital-to-analog converter (DAC) 32 (data voltage generation circuit), a data line driver circuit 34, a scan drive control section 36, and a correction circuit 70.

The shift register 22 includes a flip-flop corresponding to each data line. These flip-flops are sequentially connected. The shift register 22 is configured so that an enable input-output signal EIO is held by the first flip-flop and is sequentially shifted to the adjacent flip-flops in synchronization with a dot clock signal DCLK.

The line latch 24 includes a latch (image data register) corresponding to each data line. Grayscale data DIO is input to the line latch 24 from the display controller 40. Each latch of the line latch 24 latches grayscale data corresponding to each data line in synchronization with the enable input-output signal EIO sequentially shifted by the shift register 22.

The line latch 26 latches the grayscale data corresponding to one horizontal scan latched by the line latch 24 in synchronization with a horizontal synchronization signal LP supplied from the display controller 40.

The multiplexer circuit 28 multiplexes the grayscale data corresponding to each data line supplied from the line latch 26 by time division to generate time-division multiplexed grayscale data corresponding to the data voltage supply lines SR, SG, and SB (S1 to Sk).

The scan drive control section 36 generates a scan drive clock signal CLK that specifies the scan drive time division timing. Specifically, the scan drive control section 36 generates n clock signals for sequentially driving the first to nth blocks within one horizontal scan period. The multiplexer circuit 28 receives the clock signal CLK, and multiplexes the grayscale data corresponding to the first to nth blocks by time division within one horizontal scan period. The shift register SF of the liquid crystal panel 12 receives the clock signal CLK, and sequentially causes the switch elements in the first to nth blocks to be turned ON/OFF.

The grayscale voltage generation circuit 30 (reference voltage generation circuit) generates the grayscale voltage (reference voltage), and supplies the grayscale voltage to the DAC 32.

The DAC 32 (D/A conversion circuit) generates the data voltage (source voltage) supplied to each data line (source line). Specifically, the DAC 32 selects one of the grayscale voltages supplied from the grayscale voltage generation circuit 30 based on the digital grayscale data supplied from the multiplexer circuit 28, and outputs the selected grayscale voltage as an analog data voltage.

The correction circuit 70 outputs the correction output voltage to the data line driver circuit 34 to correct the data voltage. The correction circuit 70 includes a correction D/A conversion circuit, a correction voltage generation circuit, and a control circuit (e.g., correction D/A conversion circuits 120 or 130-1 to **130-*k*, correction voltage generation circuit 180 or 190, and control circuit 200 shown in FIG. 7** etc.).

The data line driver circuit 34 buffers the data voltage from the DAC 32 and the correction output voltage from the correction circuit 70, and drives the data line. For example, the data line driver circuit 34 includes a driver circuit provided corresponding to each data line (e.g., data line driver circuit shown in FIG. 13 etc.).

5. Electronic Instrument

Figure 21A:
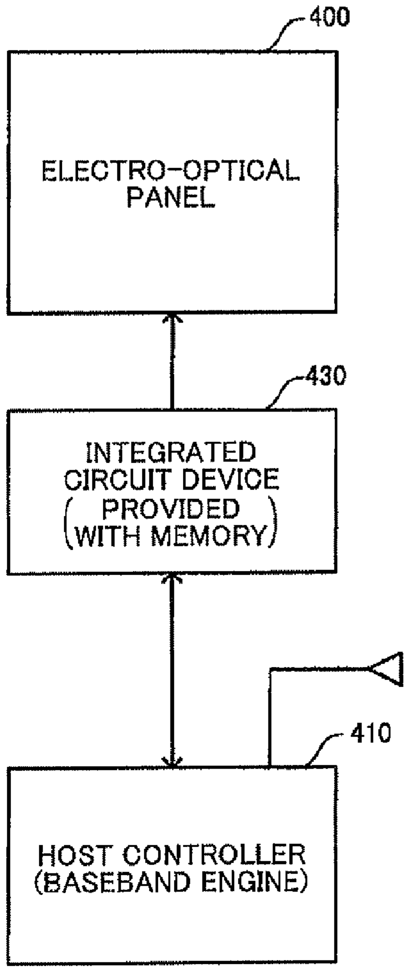
FIGS. 21A and 21B show configuration examples of an electronic instrument.
Figure 21B:
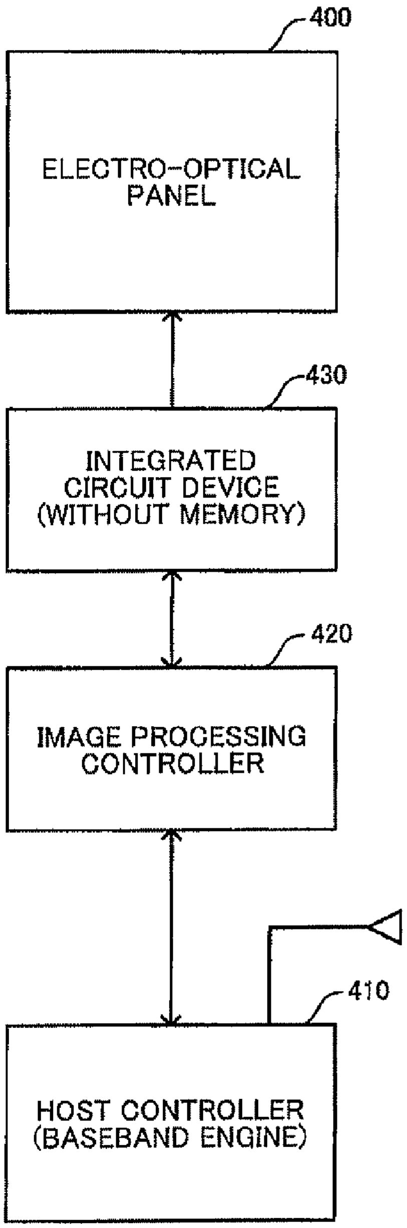

FIGS. 21A and 21B show configuration examples of a portable telephone (electronic instrument) that includes the integrated circuit device according to the above embodiment. Note that various modifications may be made, such as omitting some of the elements shown in FIGS. 21A and 2113 or adding other elements (e.g., camera, operation section, or power supply). The electronic instrument according to this embodiment is not limited to a portable telephone, but may be a digital camera, a PDA, an electronic notebook, an electronic dictionary, a projector, a rear-projection television, a portable information terminal, or the like.

In FIGS. 21A and 21B, a host controller 410 is a microprocessor unit (MPU), a baseband engine (baseband processor), or the like. The host controller 410 controls an integrated circuit device 430 (i.e., driver). The host controller 410 may also perform a process of an application engine or a baseband engine, or a process (e.g., compression, decompression, or sizing) of a graphic engine. An image processing controller 420 shown in FIG. 21B performs a process (e.g., compression, decompression, or sizing) of a graphic engine instead of the host controller 410.

In FIG. 21A, the integrated circuit device 430 includes a memory. In this case, the integrated circuit device 430 writes image data from the host controller 410 into the built-in memory, reads the image data from the memory, and drives an electro-optical panel 400. In FIG. 21B, the integrated circuit device 430 does not include a memory. In this case, image data output from the host controller 410 is written into a memory provided in the image processing controller 420. The integrated circuit device 430 drives the electro-optical panel 400 under control of the image processing controller 420.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g., data voltage, grayscale voltage, correction voltage, driver, liquid crystal panel, and liquid crystal display device) cited with a different term (e.g., data signal, grayscale signal, correction signal, integrated circuit device, electro-optical panel, and electro-optical device) having a broader meaning or the same meaning at least once in the specification and the drawings can be replaced by the different term in any place in the specification and the drawings. The configurations and the operations of the data line driver circuit, the D/A conversion circuit, the correction D/A conversion circuit, the control circuit, the integrated circuit device, the electro-optical device, the electronic instrument, and the like are not limited to those described with regard to the above embodiments. Various modifications and variations may be made.

What is claimed is:

1. An integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a plurality of D/A conversion circuits that are respectively provided corresponding to the plurality of data line driver circuits, each of the plurality of D/A conversion circuits receiving image data, and outputting an output signal that corresponds to the image data, each of the plurality of data line driver circuits including:

an operational amplifier;

an input capacitor that is provided between a summing node and an input node of the data line driver circuit, the summing node being connected to a first input terminal of the operational amplifier; and a first correction capacitor that is provided between the summing node and a first correction input node of the data line driver circuit, each of the plurality of D/A conversion circuits outputting the output signal to the input capacitor of the corresponding data line driver circuit among the plurality of data line driver circuits, and the first correction D/A conversion circuit outputting the first correction output signal to the first correction capacitors of the plurality of data line driver circuits to correct data signals output from the plurality of data line driver circuits.

2. The integrated circuit device as defined in claim 1, further comprising:

a grayscale signal generation circuit that outputs a grayscale signal to the plurality of D/A conversion circuits, the grayscale signal having non-linear grayscale characteristics with respect to the image data; and a first correction signal generation circuit that outputs a first correction signal to the first correction D/A conversion circuit, the first correction signal having linear grayscale characteristics with respect to the first correction data.

3. The integrated circuit device as defined in claim 1, further comprising:

a control circuit that outputs the first correction data to the first correction D/A conversion circuit, the control circuit outputting the first correction data while changing the first correction data every scan line or at intervals of a plurality of scan lines.

4. The integrated circuit device as defined in claim 3, the control circuit including a line count setting register, a number of scan lines being set in the line count setting register, the first correction data being changed at intervals of the number of scan lines set in the line count setting register.

5. The integrated circuit device as defined in claim 3, the control circuit including a change width setting register, a change width when changing the first correction data being set in the change width setting register.

6. The integrated circuit device as defined in claim 1, further comprising:

a control circuit that outputs the first correction data to the first correction D/A conversion circuit, the control circuit including a chip-to-chip variation correction register that stores chip-to-chip variation correction data, and the first correction D/A conversion circuit correcting a chip-to-chip variation in the data signals output from the plurality of data line driver circuits based on the chip-to-chip variation correction data.

7. The integrated circuit device as defined in claim 6, the control circuit including an initial information storage circuit, the chip-to-chip variation correction data being set in the initial information storage circuit during production of the integrated circuit device; and the chip-to-chip variation correction register storing the chip-to-chip variation correction data that is read from the initial information storage circuit.

8. The integrated circuit device as defined in claim 1, each of the plurality of data line driver circuits including:

a first switch element that is provided between the input node and a first node;

a second switch element that is provided between the first node and an analog reference power supply;

a feedback capacitor that is provided between the summing node and a second node;

a third switch element that is provided between the second node and an output node;

a fourth switch element that is provided between the second node and the analog reference power supply;

a fifth switch element that is provided between the summing node and the output node;

a first correction switch element that is provided between the first correction input node and a third node; and a second correction switch element that is provided between the third node and a first correction reference voltage node, a first correction reference voltage being supplied to the first correction reference voltage node, an analog reference power supply voltage being supplied to a second input terminal of the operational amplifier, the output node being connected to an output terminal of the operational amplifier, the input capacitor being provided between the first node and the summing node, and the first correction capacitor being provided between the third node and the summing node.

9. The integrated circuit device as defined in claim 1, each of the plurality of data line driver circuits including:

a first switch element that is provided between the input node and a first node;

a second switch element that is provided between the first node and an output node;

a third switch element that is provided between the summing node and the output node;

a first correction switch element that is provided between the first correction input node and a second node; and a second correction switch element that is provided between the second node and a first correction reference voltage node, a first correction reference voltage being supplied to the first correction reference voltage node, an analog reference power supply voltage being supplied to a second input terminal of the operational amplifier, the output node being connected to an output terminal of the operational amplifier, the input capacitor being provided between the first node and the summing node, and the first correction capacitor being provided between the second node and the summing node.

10. The integrated circuit device as defined in claim 1, further comprising:

a plurality of second correction D/A conversion circuits, the plurality of second correction D/A conversion circuits being respectively provided corresponding to the plurality of data line driver circuits, each of the plurality of data line driver circuits including a second correction capacitor that is provided between the summing node and a second correction input node of the data line driver circuit; and each of the plurality of second correction D/A conversion circuits receiving second correction data that corresponds to the corresponding data line driver circuit among the plurality of data line driver circuits, and outputting a second correction output signal that corresponds to the second correction data to the second correction capacitor to correct the data signal output from the corresponding data line driver circuit.

11. The integrated circuit device as defined in claim 10, further comprising:

a grayscale signal generation circuit that outputs a grayscale signal to the plurality of D/A conversion circuits, the grayscale signal having non-linear grayscale characteristics with respect to the image data; and a second correction signal generation circuit that outputs a second correction signal to the plurality of second correction D/A conversion circuits, the second correction signal having linear grayscale characteristics with respect to the second correction data.

12. An integrated circuit device comprising:

a plurality of data line driver circuits, each of the plurality of data line driver circuits driving a corresponding data line among a plurality of data lines;

a first correction D/A conversion circuit that receives first correction data, and outputs a first correction output signal that corresponds to the first correction data; and a second correction D/A conversion circuit that receives second correction data, and outputs a second correction output signal that corresponds to the second correction data, each of the plurality of data line driver circuits including:

an operational amplifier;

an input capacitor that is provided between a summing node and an input node of the data line driver circuit, the summing node being connected to a first input terminal of the operational amplifier; and a correction capacitor that is provided between the summing node and a correction input node of the data line driver circuit, a signal that is obtained by dividing a signal between the first correction output signal and the second correction output signal being input to the correction capacitor of each of the plurality of data line driver circuits.

13. An integrated circuit device comprising:

a plurality of data line driver circuits, each of the plurality of data line driver circuits driving a corresponding data line among a plurality of data lines;

a plurality of correction D/A conversion circuits that are respectively provided corresponding to the plurality of data line driver circuits; and a plurality of D/A conversion circuits that are respectively provided corresponding to the plurality of data line driver circuits, each of the plurality of data line driver circuits including:

an operational amplifier;

an input capacitor that is provided between a summing node and an input node of the data line driver circuit, the summing node being connected to a first input terminal of the operational amplifier; and a correction capacitor that is provided between the summing node and a correction input node of the data line driver circuit, each of the plurality of D/A conversion circuits receiving image data, and outputting an output signal that corresponds to the image data to the input capacitor of the corresponding data line driver circuit among the plurality of data line driver circuits, and each of the plurality of correction D/A conversion circuits receiving correction data that corresponds to the corresponding data line driver circuit among the plurality of data line driver circuits, and outputting a correction output signal that corresponds to the correction data to the correction capacitor to correct a data signal output from the corresponding data line driver circuit.

14. An electronic instrument comprising the integrated circuit device as defined in claim 1.

15. An electronic instrument comprising the integrated circuit device as defined in claim 12.

16. An electronic instrument comprising the integrated circuit device as defined in claim 13.

* * * * *